United States Patent [19]
Kitagawa et al.

[11] Patent Number: 5,198,690
[45] Date of Patent: Mar. 30, 1993

[54] ELECTROLUMINESCENT DEVICE OF II-IV COMPOUND SEMICONDUCTOR

[75] Inventors: Masahiko Kitagawa, Shiki; Yoshitaka Tomomura; Kenji Nakanishi, both of Nara, all of Japan

[73] Assignee: Sharp Kabushiki Kaisha, Japan

[21] Appl. No.: 796,684

[22] Filed: Nov. 25, 1991

[30] Foreign Application Priority Data

Nov. 26, 1990 [JP] Japan ................................ 2-324346
Nov. 27, 1990 [JP] Japan ................................ 2-331909

[51] Int. Cl.⁵ .................... H01L 33/00; H01L 27/14; H01S 3/19
[52] U.S. Cl. .................... 257/200; 257/201; 372/43; 372/44
[58] Field of Search .................... 357/16, 17, 30 B, 61; 372/43, 44, 50

[56] References Cited

U.S. PATENT DOCUMENTS

| | | | |
|---|---|---|---|
| 4,794,606 | 12/1988 | Kondow et al. | 372/44 |
| 4,955,031 | 9/1990 | Jain | 372/44 |
| 5,010,376 | 4/1991 | Nishimura et al. | 357/17 |
| 5,037,709 | 8/1991 | Tomomura et al. | 357/17 |
| 5,045,897 | 9/1991 | Ahlgren | 357/17 |
| 5,055,363 | 10/1991 | Tomomura et al. | 357/17 |
| 5,097,298 | 3/1992 | Ehara | 357/17 |
| 5,101,109 | 3/1992 | Jiang et al. | 357/30 B |
| 5,103,269 | 4/1992 | Tomomura et al. | 357/17 |
| 5,112,410 | 5/1992 | Chen | 357/30 B |
| 5,113,233 | 5/1992 | Kitagawa | 357/17 |

FOREIGN PATENT DOCUMENTS

| | | |
|---|---|---|
| 0357458 | 3/1990 | European Pat. Off. . |
| 63-184373 | 7/1988 | Japan ................................ 357/17 |
| 2-100381 | 4/1990 | Japan ................................ 357/17 |
| 1042264 | 9/1966 | United Kingdom . |

*Primary Examiner*—Rolf Hille
*Assistant Examiner*—Mahshid Saadat
*Attorney, Agent, or Firm*—Nixon & Vanderhye

[57] ABSTRACT

An electroluminescent device of compound semiconductor which is made of II-IV compound semiconductor to be in pn junction type, wherein n layer of the pn junction part comprises a II-VI compound semiconductor layer containing comprises a II-VI compound semiconductor layer containing zinc as an essential composite element and p layer of the pn junction part comprises a II-VI compound semiconductor layer having an epitaxial layer containing M, Be and Te (wherein M is Cd or Zn) as an essential composite element.

6 Claims, 17 Drawing Sheets

FIG. 24 Cd Be Te EMISSION SPECTRUM

ELECTROLUMINESCENT DEVICE OF II-IV COMPOUND SEMICONDUCTOR

BACKGROUND OF THE INVENTION

1. Field of the Invention

The invention relates to an electroluminescent device of compound semiconductor and more particularly to a structure of an electroluminescent device of pn junction type comprising II-VI compound semiconductor of larger bandgap and being capable of emitting light in wavelength blue to ultraviolet.

2. Description of the Related Art

A conventional light emitting diode made of II-VI compound semiconductor and adapted to emit light in visible short wave range does, as shown in FIG. 26, generally comprise a substrate 101 made of GaAs(100), n type ZnSe:Ga layer 102 and p type ZnSe:O layer 103 each formed on the substrate in this order and is provided with a negative electrode Al 100 and a positive electrode Au 104 (as disclosed, for example, in K. Akimoto et al. Japan. J. Appl. Phys. 28(1989) L2001). The blue light emitting diode of the conventional structure emits blue light of peak wave 440 nm at low temperature of liquid nitrogen (77K, −196° C.) but does provide almost no emission at room temperature (25° C.).

The conventional electroluminescent device, in particular, the electroluminescent device made of II to VI compounds semiconductor which is expected (and able) to emit light with high luminous efficiency places the foregoing ZnSe layer, which emits blue light, directly on the GaAs substrate. Hence, crystals of the layers have difference (about 0.3%) in lattice constant, so that defect of very high density is introduced into the ZnSe epitaxial growth layer to cause the same layer to be largely deteriorated in crystallizability.

The defect created above substantially decreases luminous intensity 440 nm (77K) in bandgap of ZnSe when the layer is not applied with any impurity. Gallium (Ga) may be added as n type impurity as used in the conventional example to reduce density of the defect and increase the luminous intensity 440 nm. Since completeness of crystals depends in principle on lattice constant of the epitaxial junction structure of the crystals, defect due to heteroepitaxial growth still remains much in crystals except the case using a thin film structure comprising an ultra thin film.

Crystallizability of ZnSe:O formed by adding, for example, oxygen (O) onto the above heteroepitaxial growth layer of low quality is poor. The ZnSe:O epitaxial layer serving as p type layer for applying current cannot provide a sufficient amount of carriers (positive holes) in ZnSe:Ga emitting layer for emission; is not evaluated precisely by Hall Measurement Method; and is an impurity added film of quite low luminous efficiency wherein hole density is to be one thousandth of added oxygen atoms. This is caused not only by the fact that oxygen is not p type impurity in valency with respect to selenium but also that oxygen is poor in crystallizability.

Similarly, other conventional examples of the similar structures which formed on GaAs to provide p type epitaxial layer by using ZnSe:Li,N (T. Yasuda et al. Appl. Phys. Lett.52(1988)57) or ZnS:N (M. Migita et al, Abstracts. 4th I.C. on II-VI compounds, II-VI' 89, Fr-3-3) merely exhibit the properties of the same degree as the above example. Hence, such problems hindering the industry in development have been revealed that the devices when used as light emitting diode are deteriorated in a short time, do not emit light at room temperature and is poor in reproducibility for manufacture.

The problems of the conventional electroluminescent device of II-VI compound semiconductor are summarized as follows:

(1) Quality of crystals of a light emitting layer is low due to inconformity of lattice constant between crystals of substrate and epitaxially grown layers.

(2) Although a layer (generally of p type) for current application formed as epitaxial crystals is more sensitive in their properties to a structure (defects) than a light emitting layer is, this layer is poor in crystallizability.

(3) Hence, the devices are low in efficiency of current application and recombined emission, unstable in emitting properties and poor in reproducibility, and the whole properties do not at all reach a practical use level.

As seen from the above, it is decisive on practical use of the device in the industry that the essential technology to prepare electroluminescent devices including high luminance blue light emitting diode has not been well established.

An object of the present invention is to provide an electroluminescent device of II-VI compound semiconductor having a composition which can solve the problems revealed in the above conventional electroluminescent devices of II-VI compound semiconductor.

SUMMARY OF THE INVENTION

According to the present invention, there is provided an electroluminescent device of compound semiconductor which is made of II-VI compound semiconductor to be in pn junction type, wherein n layer of the pn junction part comprises a II-VI compound semiconductor layer containing zinc as an essential composite element and p layer of the pn junction part comprises a II-VI compound semiconductor layer having an epitaxial layer containing M, Be and Te (wherein M is Cd or Zn) as an essential composite element.

The n layer of the pn junction part of the present invention is adapted to act as a light emitting layer and the p layer formed on the n layer is a semiconductor layer of a wider bandgap and relatively less crystalline quality dependency, serving as a current application part. Hence, a sufficient amount of carriers may be applied into the n layer to obtain a structure of electroluminescent device, such as blue light emitting diode, capable of emitting light in short wave range with high luminous efficiency.

DETAILED DESCRIPTION OF THE PREFERRED EMBODIMENTS

Figure 1:
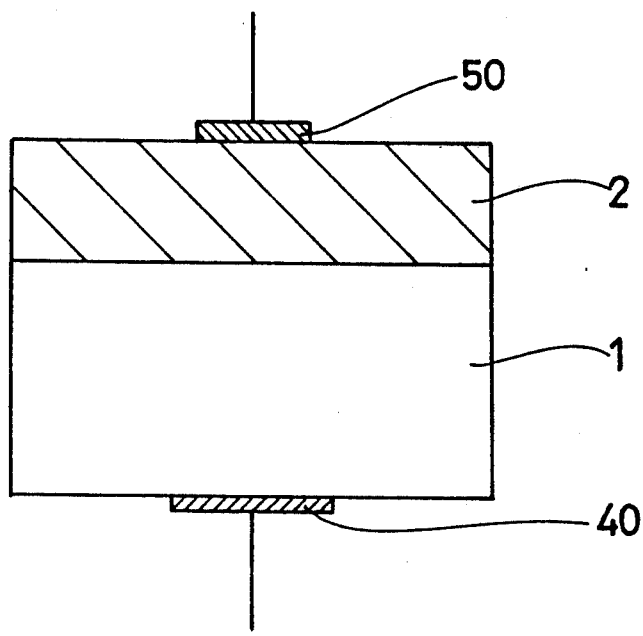
FIGS. 1 to 22 are schematic diagrams showing the examples of electroluminescent devices made of various compound semiconductors according to the present invention.

The electroluminescent device of compound semiconductor of the present invention comprises an electroluminescent device of pn junction type including an epitaxial layer made of II-VI compound semiconductor wherein a positive electrode is formed at the side of p layer and a negative electrode at the side of n layer, so that light is emitted by application of voltage. The negative electrode may be connected with either a compound semiconductor substrate constituting n layer or a buffer layer on the substrate. In the latter case, the negative electrode may be connected directly to the buffer layer via a through bore provided in the compound semiconductor substrate. The through bore may be in shape of groove ("through groove"), formed corresponding to configuration of electrodes by various etching techniques, such as reactive ion beam etching or chemical etching processes. Also, the through bore may be provided in a predetermined position in the compound semiconductor substrate before or after formation of the buffer layer. Formation of electrodes at the substrate side may be conducted by vapor deposition, sputtering or MBE process, using various metals hitherto available, such as In, Al, Au or the like (See U.S. patent application Ser. No. 07/635,424). For constituting an electroluminescent devices of combined function, such as an integrated circuit, a photo detector or the like, any additional electrodes to the above positive and negative electrodes may be provided.

The n layer provided in the present invention comprises a II-VI compound semiconductor layer containing zinc as an essential composite element and n type impurity added to the compound semiconductor.

II-VI compound semiconductor containing zinc as an essential composite element may employ two elements compound such as ZnS, ZnTe, ZnSe or the like, three elements compound, such as ZnCdS, ZnCdTe, ZnSTe, ZnSeTe, ZnBeS, ZnBeSe, ZnHgTe, ZnHgS, ZnMgTe, ZnBeTe or the like, or four or more elements compound.

The II-VI compound semiconductor layer may be provided by using a single crystal substrate as it is or epitaxially grown. In the latter case, a crystalline substrate of the above II-VI compound semiconductor or of CdBeTe, HgBeTe, GaAs, GaP, Si, Ge or the like may be used. The substrate is preferably single crystal, and preferable materials for the substrate is ZnSe, ZnS, or $ZnS_{1-z}Se_z$.

In case that the II-VI compound semiconductor layer is formed on the substrate by epitaxial growth process, a buffer layer may be preferably provided between the compound semiconductor layer and the substrate for reducing deformation caused therebetween due to difference of the respective lattice constant. The buffer layer preferably uses a super lattice layer or composite-inclined epitaxial layer and more preferably is made of $ZnS_{1-z}Se_z$.

The substrate which is given surface orientation (100) in the above example may alternatively use inclined substrate of surface orientation (110), (111) or (311) similarly in the case using the substrate as II-VI compound semiconductor layer forming n layer.

Figure 24:
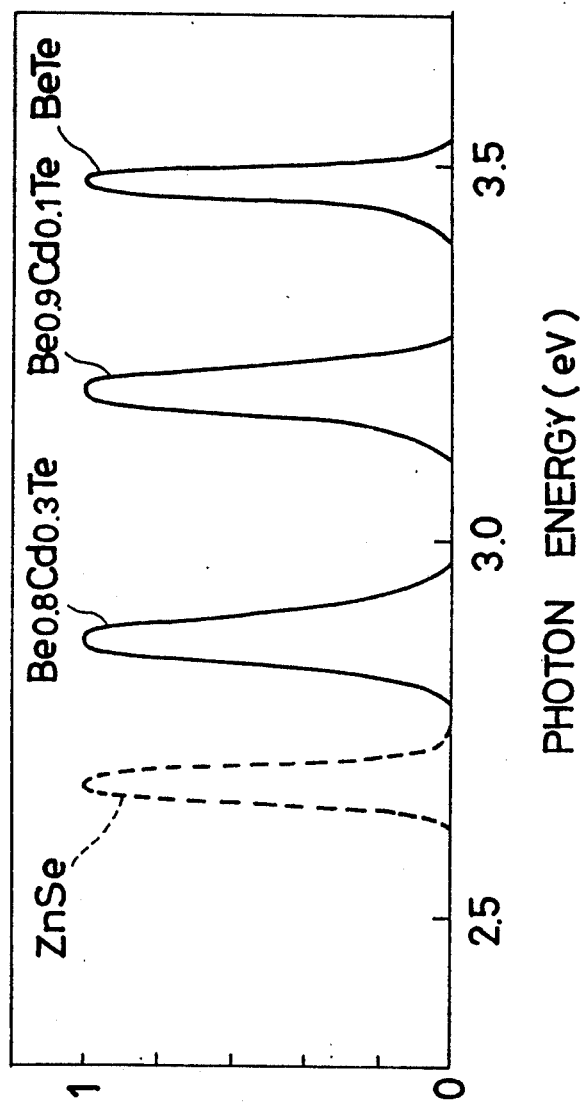
FIG. 24 is a graph showing a relationship between photon energy and luminous intensity of CdBeTe in emission spectrum.
Figure 25:
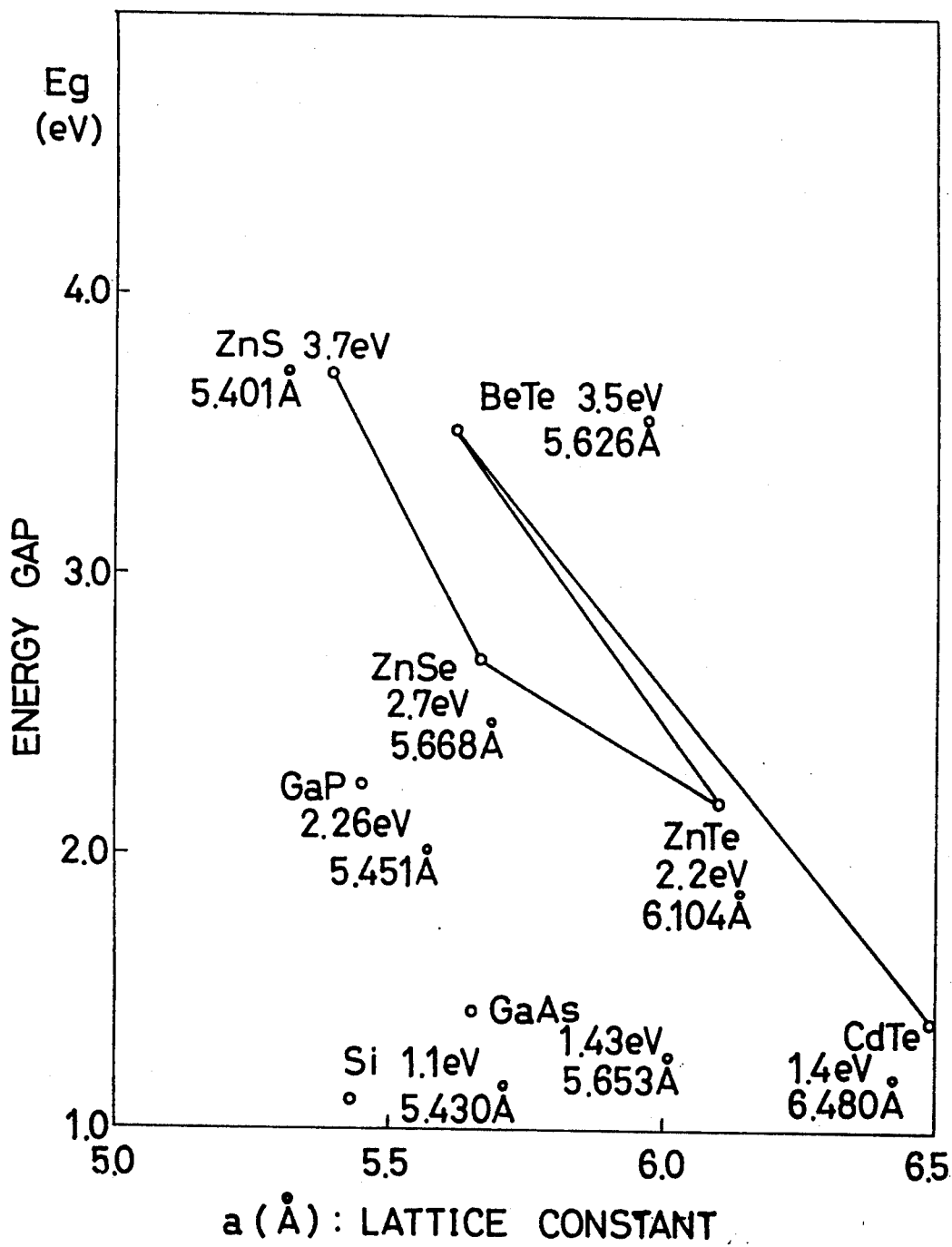
FIG. 25 is a graph showing a relationship between lattice constant and energy gap.

The p layer of the pn junction part may comprise an epitaxial layer containing M, Be and Te (wherein M is Cd or Zn), such as ZnBeTe, CdBeTe, ZnCdBeTe, ZnBeSTe, ZnBeSeTe, CdBeSTe or the like and preferably uses ZnBeTe or CdBeTe. The composite element Te reduces dependency on crystalline quality for the properties required by a current application layer and assists to readily form p type, and Be makes larger band gap. The p layer is preferable to have band gap larger than that of the n layer so as to improve the properties of current application and allow light emitted from the n layer to be effectively transmitted through the p layer. For example, in case that the n layer is made of ZnSe, when the p layer uses $Zn_{1-x}BeTe$, x is preferably $0.2 \leq x \leq 1.0$, and when using $Cd_{1-x}Be_xTe$, $0.7 \leq x \leq 1.0$ (See FIG. 24-25).

Figure 26:
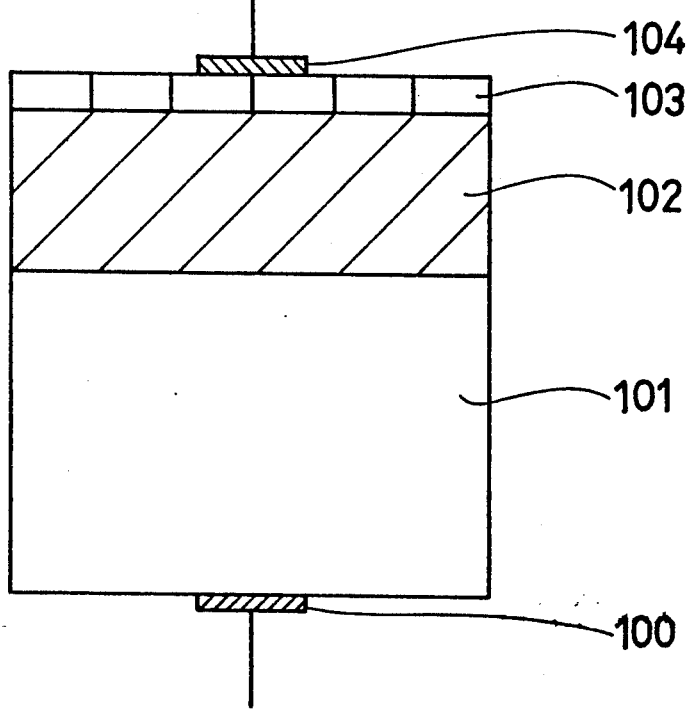
FIG. 26 is a schematic diagram showing a conventional electroluminescent device of compound semiconductor.

A relationship between various compositions and specific lattice constant and energy gap is shown in FIG. 26. As seen in the graph, it is preferable to use $ZnS_{1-z}Se_z$ ($0 \leq z \leq 1$) as n layer to achieve emission of further shorter wavelength, and $ZnS_{1-z}Se_z$ ($0 < z < 1$) to provide conformity of lattice between the p and n layers, using ZnBeTe or CdBeTe for the p layer.

The p layer of the present invention has less crystalline quality dependency to thereby be not readily influenced by crystallizability of the n layer. But, the n layer is preferably single crystal and may use a single crystal substrate of $ZnS_{1-z}Se_z$ ($0 \leq z \leq 1$) as it is or epitaxially grown on it.

Also, ZnS and ZnSe may be alternately heaped up at an interface between the n and p layers to form an super lattice layer, or a composite-inclined epitaxial layer comprising $ZnS_{1-x}Se_x$ ($0 < x < 1$) other than the super lattice layer may be formed at the interface.

Impurities to be added for formation of n layer may use known ones, such as Al, Ga, In or Tl in III group, F, Cl, Br or I in VII group, or the like.

The p layer may be formed by implanting Li, Na, K, Cu, Ag, Au in I group or N, P, As, Sb in V group into the light emitting layer at an amount enough to provide a sufficient amount of carriers.

The foregoing compound semiconductor substrate, buffer layer and epitaxial layer may be provided selectively by MBE process, CVD (chemical vapor deposition) process, MOCVD (metal organic chemical vapor deposition) process, ALE (atom layer epitaxy) process, or IBE (ion beam epitaxy) process for thin film growth.

EXAMPLES

Next, the examples of the present invention will be detailed with referring to the accompanied drawings.

EXAMPLE 1

The first example of the present invention will be detailed by exemplifying a Electroluminescent device using ZnSe as substrate crystalline.

FIG. 1 is a diagram showing a structure of the Electroluminescent device of the first example of the present invention. n type substrate crystalline ZnSe:Ga1 is ZnSe(100) substrate in thickness of 300 μm which is cut out of ingot of single-crystal ZnSe grown by iodine transport process. ZnSe of the substrate was heated in Zn+Ga solution (Zn90:Ga10) at 950° C. for 100 hours to have low resistivity (1 Ω. cm). p type epitaxial crystalline layer $Cd_{1-x}Be_xTe$:As 2 on the n type ZnSe(100) substrate 1 were formed by molecular beam epitaxy process (MBE) and has resistivity of 0.1 Ω.cm.

In the MBE growth, the ZnSe substrate was first applied with chemical etching in a methanol (CH$_3$OH) solution added with 5% of Br followed by treating surface of the device for purification in ultra-high vacuum of 1 to 3×10$^{-10}$ at 500° C. for few minutes to 30 min. Then, on the surface of ZnSe(100) single-crystal substrate 1 set at 260° C. were grown Cd at molecular beam pressure 3×10$^{-8}$ Torr, Be at molecular beam pressure 5×10$^{-7}$ Torr, Te at molecular beam pressure 4.7×10$^{-7}$ Torr and As at molecular beam pressure 2×10$^{-10}$ Torr for 1.5 hour to form p type Cd$^{1-x}$Be$^x$Te:As growth layer 2 (x=0.95).

In FIG. 1, 40 is a negative electrode made of Al, and 50 a positive electrode made of Au. The Au positive electrode 50 was preferably provided in such manner that after formation of CdBeTe:As epitaxial layer, the positive electrode was deposited in vacuum of 1 to 3×10$^{-9}$ Torr in an electrode formation chamber adjacent to MBE chamber through a transport room and heated together with Al negative electrode 40 at 300° C. to be ohmic. The Al negative electrode 40 was formed by electron beam deposition in such manner that after chemical etching, the rear surface of ZnSe substrate 1 was removed 20 to 100 μm in thickness in vacuum less than 1×10$^{-8}$ Torr and Al was deposited on the rear surface of ZnSe:Ga substrate 1 heated to 300° C. to form an ohmic electrode.

The CdBeTe:As epitaxial layer 2 formed above has lattice constant 5.672 Å differing 0.1% or less from lattice constant of ZnSe in the substrate (5.668 Å), thereby exhibiting an electron beam diffraction pattern in a quite excellent streak shape to confirm that the layer 2 is an excellent single-crystal epitaxial film.

The Electroluminescent device allowed current 20 mA to flow therthrough at 3 V by application of voltage and emitted at room temperature blue light of peak wave about 460 nm recombined in band gap of ZnSe. Observed in emission spectrum upon application of current were only faint emission about 530 nm in wavelength and 1/10000 or less in intensity together with the main light emission band 460 nm in wavelength.

As explained in the example, the light emitting layer comprises a single-crystal substrate, so that light emission spectrum is the substantially same as that observed in photo luminance of the substrate itself. Also, intensity of band gap emission (460 nm emission band) increases depending on applied current density, so that it can be set to such driving condition that ignores other low energy emission (530 nm emission shown in the present example) whose intensity depends mainly on defects or the amount of impurities.

CdBeTe:As layer 2 comprising the epitaxial film 2 has lattice constant substantially corresponding to that of ZnSe substrate 1 (5.668 Å) to form a single-crystal layer of high quality as a whole, thereby exhibiting an excellent electrical properties (0.1 Ω.cm) as a current application layer.

As seen in the present example, the present invention enables blue light emitting diode of a quite simple construction with high luminous efficiency.

EXAMPLE 2

Figure 2:
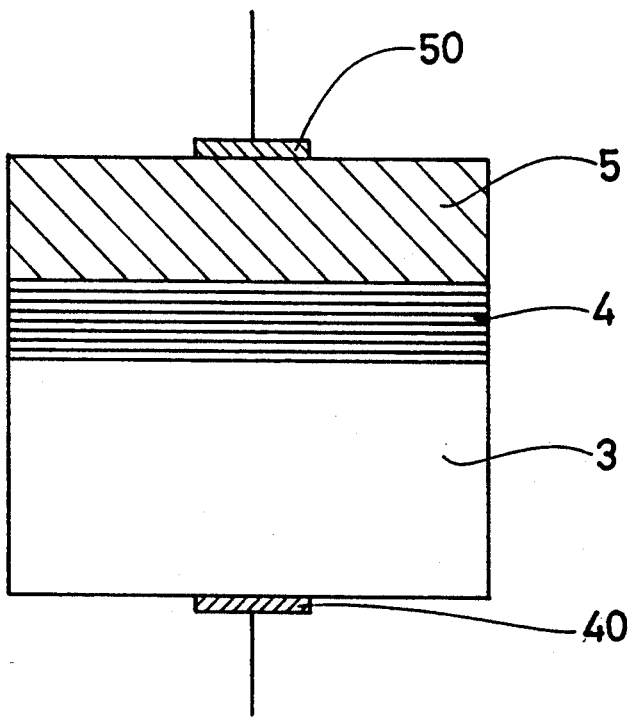

A second example of the present invention is shown in FIG. 2.

The device was prepared by MBE process as in the first example. In FIG. 2, 3 is n type ZnS(100) substrate, 4 n type ZnS/ZnSe ultra-lattice epitaxial layer, and 5 p type Cd$_{1-x}$Be$_x$Te:P epitaxial layer. Also, 40 is Al negative electrode and 50 Au positive electrode, these being provided substantially in the same manner as in the first example except the heating condition for fomring ohmic electrodes.

The n type ZnS(100) substrate 3 was a single-crystal substrate made of bulk single-crystal prepared by iodine transport process and was processed, in melting zinc added with 10% of Al, at 950° C. for 100 hours to have low resistivity (5 Ω.cm).

The substrate crystal was excited in photoluminescence by use of violet source of 310 nm (Xe lamp) or 325 nm (He—Cd laser) to exhibit at room temperature a broader emission band to a high luminous deep level of peak wavelength of 460 nm and a band edge emission of peak wavelength of 340 nm.

Grown on the substrate 3 in vacuum (back pressure) 1 to 2×10$^{-10}$ Torr were Zn at molecular beam pressure 1×10$^{-6}$ Torr, S at molecular beam pressure 5×10$^{-6}$ Torr, Se at molecular beam pressure 1×10$^{-6}$ Torr and with substrate temperature at 260° C. to form a ZnS/ZnSe (5 nm/5 nm-50) ultra-lattice 4 comprising 10 to 50 layers of pairs of ZnS film of 5 nm in thickness and ZnSe film of 5 nm in thickness, on whcih ultra-lattice 4 are further grown Cd at molecular beam pressure 5×10$^{-8}$ Torr, Be at molecular beam pressure 4.5×10$^{-7}$ Torr, Te at molecular beam pressure 4×10$^{-7}$ Torr and P at molecular beam pressure 1×10$^{-9}$ Torr and with the same substrate temperature to form p type CdBeTe:P layer 5. Thickness of the ultra-lattice layer 4 was 0.1 to 0.5 μm and that of CdBeTe layer 5 was 3 μm.

In the above structure, lattice incosistency between the substrate ZnS 3 and the Cd$^{1-x}$Be$^x$Te layer 5 is quite large as 4% even at minimum (i.e., x=1), so that a direct and simple heteroepitaxial growth causes CdBeTe layer to be readily twin-crystallized (polycrystallized), thereby not providing crystalline films of a sufficient high quality.

The provision of the ultra-lattice layer allows the CdBeTe layer 5 to be readily signle-crystal with high quality. CdBeTe layer may be preferably joined onto ZnSe layer.

In the structure of the present example, composition of Cd$_{1-x}$Be$_x$Te can be selected in a wider range of x (0≤x≤1, preferably 0.7≤x≤1.0). Alternatively, CdBeTe layer may be deposited with a modified composition (x) and emission wavelength may be set to 500 to 430 nm for blue light even when the CdBeTe layer makes emission.

The joint type of Electroluminescent device (x=0.95) in the example allowed current 10 mA to flow therethrough at 4 V by application of voltage and emitted at room temperature blue violet light. Emission spectrum includes a broad blue band of 460 nm peak wavelength and a violet band of about 430 nm peak wavelength, the former corresponding to blue light from the substrate 3 and the latter to violet light from the ultra-lattice layer 4. Ratio of intensity of emission of the two bands changes corresponding to applied voltage and the amount of applied current.

Relative thickness of films for the ultra-lattice layer 4 may be set to allow each layer section to be 0.5 to 10 nm in thickness. In this case, every combination of thickness may do, but ZnSe 1 nm-ZnS 9 nm is most preferable. Emission of the ultra-lattice layer 4 may be changed from 430 to 460 nm corresponding to modified specific film thickness of layer 4.

As seen in the present example, the present invention enables construction of not only blue light emitting diode with high luminous efficiency but also a light emitter of the type controlling high luminous short wavelength including violet light.

EXAMPLE 3

Figure 3:
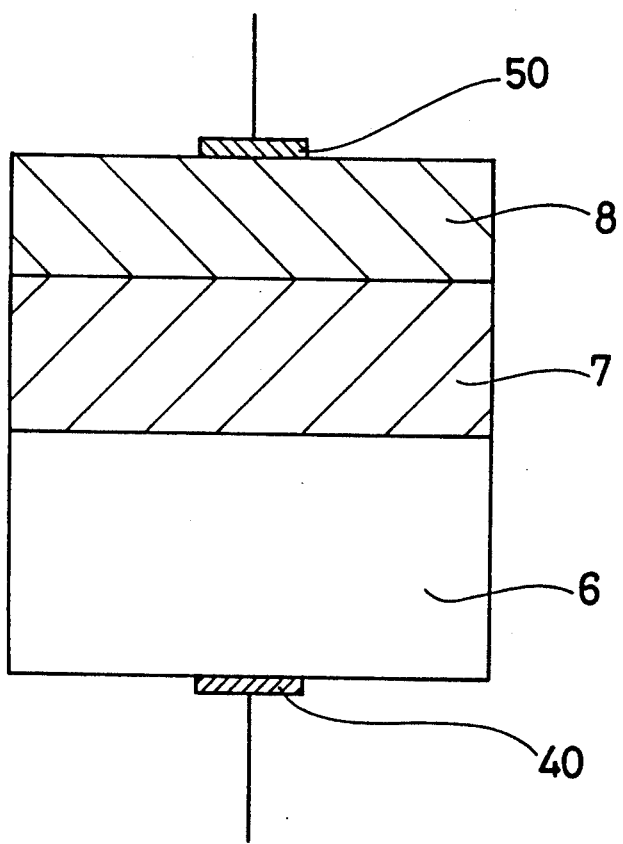

FIG. 3 shows a third example of the present invention.

The device of the present example was prepared by MBE process similarly to the foregoing examples.

In FIG. 3, 6 is wafer of ZnS(100) substrate which is n type crystal having the same resistivity as in the second example. 7 is $ZnS_{1-z}Se_z$ film of 1 μm in thickness grown by MBE, and z is a composite inclined buffer layer changing between 0 to 1 from the substrate 6 to CdBeTe growth layer 8 with concentration of Al (aluminum) being $1\times10^{18}cm^{-3}$ and resisitivity 0.05 Ω.cm. Layered on the $ZnS_{1-z}Se_z$ layer 7 was a p type CdBeTe:As layer 8 formed under the same condition as of the first example and of 2 μm in thickness and 0.1 Ω.cm of resistivity. 40 and 50 are electrodes formed in the similar manner to the foregoing two examples.

The structure of this example has the substantially same effect as of the second example. $ZnS_{1-z}Se_z$ layer 7 serving as a light emitting layer and the substrate ZnS:Al 6 contribute to emission. Particularly at low voltage, the buffer layer 7 has high emission in 460 nm narrow band at its solid solution region having ZnSe composition, and increases emission at the high ZnS composition region extending to the substrate ZnS composition under high applied voltage and applied high current density to make wider blue light emitting band of 500 nm or less in wavelength, thereby increasing luminance. When ZnSe layer in the ZnSSe layer 7 is made thicker to 0.5 to 2 μm, ZnSe emitting layer of high quality can be achieved with emission spectrum exhibiting an intensive single blue light of 80 nm of half band width and 460 nm of peak wavelength (2.65 eV).

As clearly seen in the example, the present invention can provide a novel high luminous blue light emitting device.

EXAMPLE 4

Figure 4:
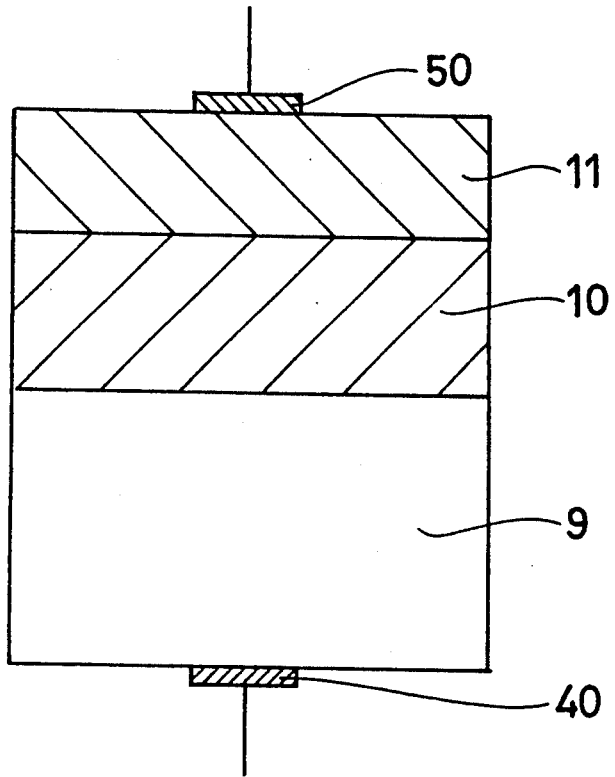

FIG. 4 shows a fourth example of the present invention.

In FIG. 4, 9 is n type GaAs(100) substrate, 10 n type ZnSe film 10 μm in thickness added with Ga and subjected to MBE growth, and 11 p type CdBeTe film 2 μm in thickness similarly added with As and subjected to MBE growth on the ZnSe film.

Figure 23:
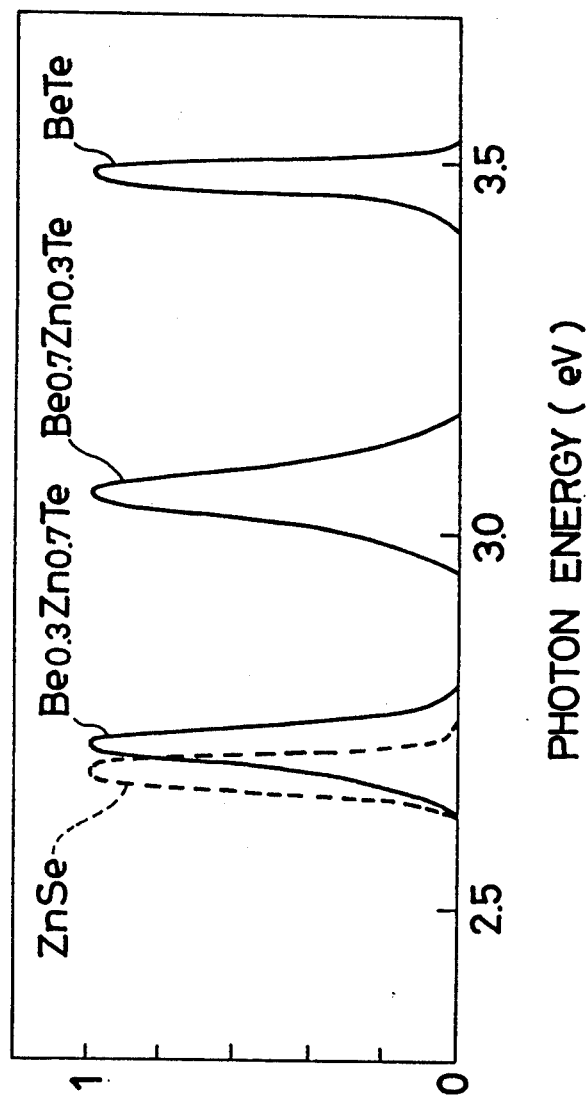
FIG. 23 is a graph showing a relationship between photon energy and luminous intensity of ZnBeTe in emission spectrum.

In the present example, lattice inconsistency between the GaAs substrate 9 and the first epitaxial layer ZnSe:Ga 10 is about 0.3% while lattice inconsistency between the first epitaxial layer ZnSe:Ga and the second epitaxial layer CdBeTe:As layer 11 is 0.1% or less with lattice constant decreasing from the substrate toward the second epitaxial layer, thereby allowing strain of lattice between the substrate epitaxial layer 10 and the epitaxial layer 11 to be relatively small. The layers have the substantially same properties as those shown in the first example. Resistivity of ZnSe:Ga layer 10 5 μm in thickness is 1 Ω.cm, and there is shown properties for a light emitter that CdBeTe:As layer 11 has resistivity of 0.1 Ω.cm and the ZnSe layer 10 causes emission due to recombination of electron and hole at band gape by applying electron-holes from CdBeTe layer 11 to ZnSe layer 10. In the present example, activity at maximum of p type impurity in CdBeTe hole applying layer is quite higher as 50% in comparison with the ZnSe:O hole applying layer in the conventional example (FIG. 23), and band gap of CdBeTe at the hole applying side is larger by about 0.7 eV than ZnSe, so that hole applying efficiency is made quite higher (improved 700 times or more in properties at room temperature in comparison with the conventional example), thereby providing quite high luminous intensity at room temperature to allow high luminous blue light of 460 nm of peak wavelength to be observed.

As clearly seen from the first example and the present fourth example, the present invention can provide a novel fundamental method of structuring ZnSe high luminous blue LED.

EXAMPLE 5

Figure 5:
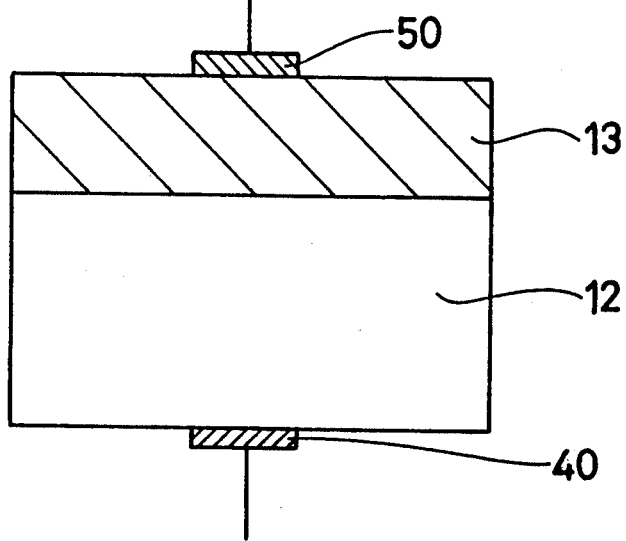

FIG. 5 shows a fifth example of the present invention.

In the present example, the substrate used ZnSSe solid solution single-crystal. Use of the present structure enables lattice conformity in crystals of substrate ZnSSe and epitaxial CdBeTe. In FIG. 5, 12 is n type $ZnS_{0.10}Se_{0.90}$ (100) substrate wafer provided in such manner that bulk single crystal grown by iodine transport process as in the second and third examples was processed to have resistivity of 1 Ω.cm and then be cut out followed by application of mechanical grinding with particles of 0.3 μm and chemical etching by use of methanol ($CH_3OH$) solution containing 5% of bromine (Br) and heating in ultra-high vacuum of 1 to $3\times10^{-10}$ Torr. $ZnS^{0.10}Se^{0.90}$ crystal has band gap energy of about 2.8 eV and wavelength at absorption end corresponds to 443 nm. Hence, the present example provides a structuring method that can enable lattice conformity and formation of a wide gap application layer. 13 is CdBeTe epitaxial layer provided on the substrate 12 to form p type CdBeTe:As layer 13 which grown for 3 hours to be 3 μm in thickness with Cd at molecular beam pressure $1.5\times10^{-8}$ Torr, Be at molecular beam pressure $3\times10^{-7}$ Torr, Te at molecular beam pressure $2.8\times10^{-7}$ Torr and As at molecular beam pressure $1\times10^{-9}$ Torr with substrate temperature at 250° C. in vacuum $2\times10^{-10}$ Torr. The CdBeTe:As layer 13 was highly added with As (preferably $1\times10^{16}$ to $1\times10^{19}cm^{-8}$ as p type impurity) to have carrier concentration $8.5\times10^{18}cm^{-3}$ and resistivity 0.01 Ω.cm, thereby being quite suitable for current (positive hole) application layer. The resultant CdBeTe layer exhibits a quite excellent crystallizability from the initial stage of crystalline growth as clearly appreciated from reflected high speed electron beam diffraction pattern.

The Electroluminescent device shown in the present example does not include such a defective interface layer even near an interface between ZnSSe substrate 12 and CdBeTe epitaxial layer 13 that has disturbed crystalline lattice caused by inconformity of the layers, so that the interface growth layer is quite low in concentration of defects and quite superior in specific properties upon applicaton of low voltage. Hence, current 10 mA or more is allowed to flow upon application of 1.5 V, and recombination due to application of current allows high luminous blue violet emission of 443 nm of peak wavelength and luminance of 50 mcd or more.

For formation of the structure shown in the example, a preferable composite range of z for $ZnS_{1-z}Se_z$ is 0.75 to 1.0. It is preferable that the composition z near the interface to the $Cd_{1-x}Be_xTe$ epitaxial layer 13 approaches the range 0.83 to 1.0 corresponding to the composition x.

As shown in the example, the present invention is quite useful in manufacture of high luminous short wave light emitting diode.

40 is In-Al negative electrode and 50 Au positive electrode.

EXAMPLE 6

Figure 6:
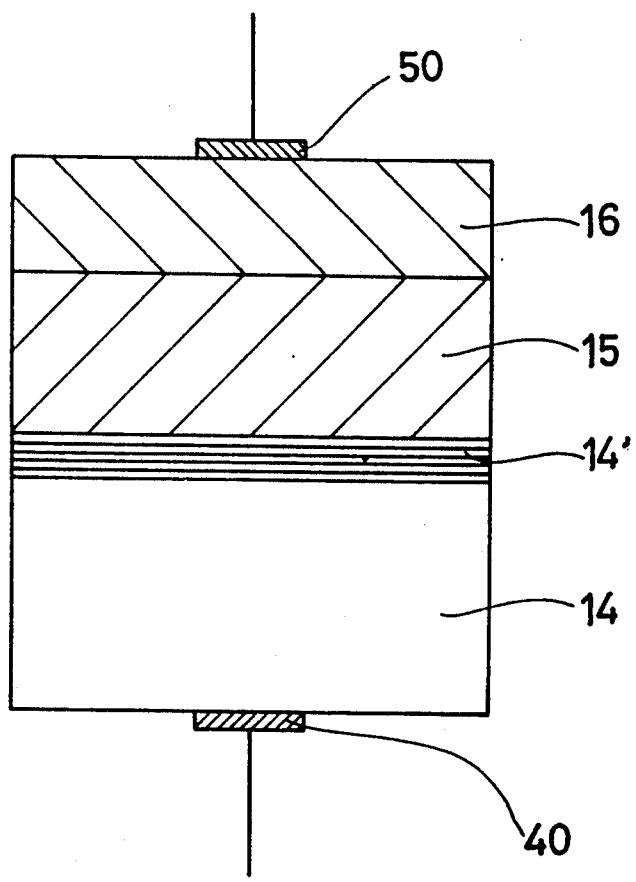

A structure of the device of a sixth example of the present invention is shown in FIG. 6.

In FIG. 6, 14 is n type ZnS(100):Al substrate of low resistivity, 15 (MBE) epitaxial n type ZnSe(100):Ga layer of low resistivity, 16 (MBE) epitaxial p type low resistivity CdBeTe(100):As layer. The similar substrates as used in the foregoing examples 1 to 4 were employed to achieve the same level of properties in the epitaxial films.

ZnS:Al(100) used as the substrate 14 and n type epitaxial substrate 15 preferably have resistivity 0.1 to 10 $\Omega$.cm, carriers density $10^{16}$ to $3 \times 10^{18} cm^{-3}$ and 0.5 $\mu$m or more in thickness (or 0.3 to 5 $\mu$m when a buffer layer 14' is provided between the substrate 14 and the epitaxial emitter substrate layer 15). Preferable resistivity of CdBeTe:As (or P) to be formed as current application layer 16 is 20 to 0.005 $\Omega$.cm and preferable carriers density is $10^{16}$ to $5 \times 10^{19} cm^{-3}$. Impurities to be introduced into the emitting layer 15 may employ indium (In), chlorine (Cl), iodine (I), bromine (Br) or fluorine (F) or the like other than Ga and Al, and those for current application layer 16 are preferably nitrogen (N), antimony (Sb), lithium (Li), sodium (Na), potassium (K) or the like other than As, P.

The device structure shown in the example can set band gap at portions other than light emitting region to be transparent to emission by use of the same feature as shown in the foregoing second, third and fifth examples, so that this structure is quite useful for a required device structure wherein emission through application of current is not reabsorbed by a substrate epitaxial layer.

EXAMPLE 7

Figure 7:
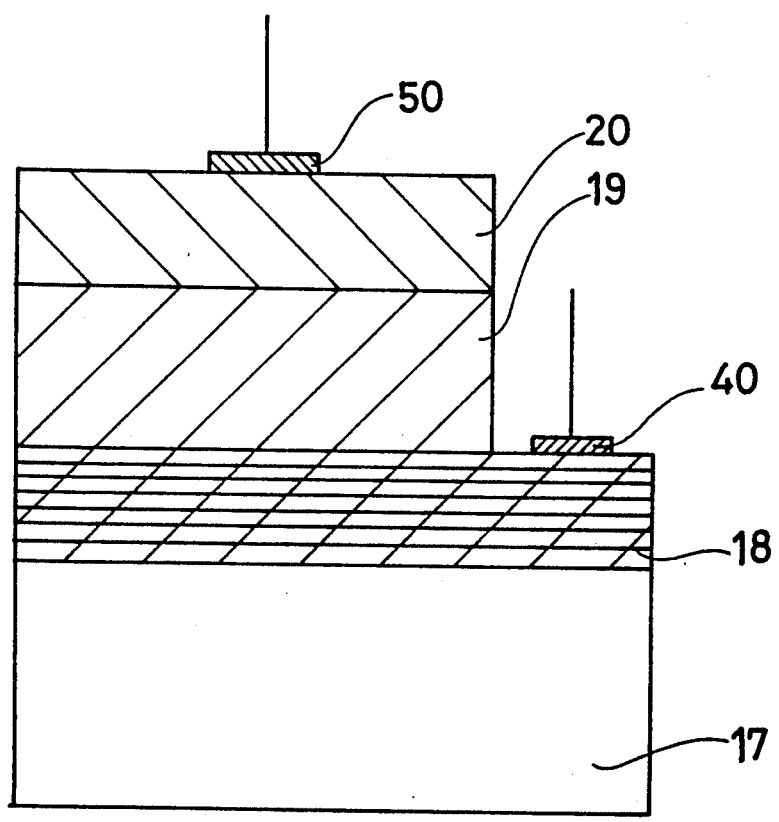

FIG. 7 shows a seventh example of the present invention.

The present example exemplifies a device structure of ultra-high luminous ZnSe blue LED comprising as current application layer CdBeTe solid solution epitaxial single-crystal 20 sequentially formed on high resistivity ZnS(100) single-crystal substrate 17.

In FIG. 7, 17 is ZnS(100) substrate of 300 $\mu$m in thickness cut out of ZnS bulk single-crystal grown by iodine transport process, and 18 is n type buffer conductive layer of ZnS/ZnSe: Al formed on the substrate 17 and comprising ZnS/ZnSe (5 nm/5 nm) ultra-lattices of 1 $\mu$m in thickness including sequentially layered sets of 100 ZnS films (5 nm in thickness) and 100 ZnSe films (5 nm in thickness) each prepared by MBE process through the same process as cited in the foregoing examples. In the ZnS layer of the buffer layer was added $3 \times 10^{19} cm^{-3}$ of Al as n type impurity and average resistivity in the layer 18 was 0.002 $\Omega$.cm, so that the layer 18 acts as a buffer conductive layer. 19 is an emitting layer formed on the ultra-lattice conductive layer of 0.5 to 6 $\mu$m in thickness and added with Al as n type impurity preferably in the range of 1016 to $10^{19} cm^{-3}$ to have resistivity of 1 to 0.01 $\Omega$.cm, so that the ZnSe:Al layer forms an excellent single-crystal film which has low resistivity and exhibits luminous properties only of band edge emission (460 nm). Thickness of the layer 19 may be decreased or increased. When the layer 19 is made thicker, the layer itself reabsorbs its emission to lower luminous efficiency. It is not preferable to use a thicker layer 19 larger in thickness than required. p type current application layer 20 of Cd0.05Be0.95Te:As formed on the emitting layer 19 is a solid solution epitaxial film having conformity of lattice with the ZnSe emitting layer 19 and forming a single-crystal film of high quality. The current application layer 20 is not limited in thickness and As may be preferably added thereto as p type impurity in the range of concentration of $1 \times 10^{16}$ to $5 \times 10^{19} cm^{-3}$. Also, the layer 20 has preferably resistivity of 0.01 to 1 $\Omega$.cm and carrier density of $1 \times 10^{16}$ to $9 \times 10^{18} cm^{-3}$. The current application layer 20 has band gap 3.4 eV and operates as a current application layer having higher current application efficiencty with respect to the ZnSe emitting layer 19. 40 and 50 are negative and positive electrodes made of Al and Au respectively as commonly provided in the examples 1 to 6. These electrodes are formed preferably in vacuum condition in an electrode formation chamber and a reactive ion beam etching chamber (RIBE) provided adjacent to MBE epitaxial vacuum chamber, in which the semiconductor layers 18 to 20 are formed, through a transport room.

Al was grown by vacuuum deposition (or electron beam deposition) at $10^{-8}$ Torr or less, and Au was also deposited in vacuum at $10^{-9}$ Torr or less. The negative and positive electrodes 40 and 50 are hard to form sufficient ohmic electrodes due to the fact that the crystalline surfaces of the layers 18 and 20 readily change in atmosphere or low vacuum ($10^{-5}$ Torr or more). Hence, the electrodes 40 and 50 are preferable to be formed in ultra-high vacuum at $10^{-8}$ Torr or less.

The light emitter device of the present example prepared as above can allow current of 1 mA or more to flow therethrough at quite low applied voltage 1.5 V or less similarly as in the preceding example 6. Upon application of low drive current, emission luminace of blue light band of peak wavelength 460 nm is over 50 mcd, thereby providing properties of blue light emitting diode with high luminance and high color purity.

As clearly seen in the present example, the present invention has a fundamental utility related to manufacture of a short wave light emitter of notably improved various properties, such as ultra-high luminous blue light emitting diode which is a quite important element for industry.

EXAMPLE 8

Figure 8:
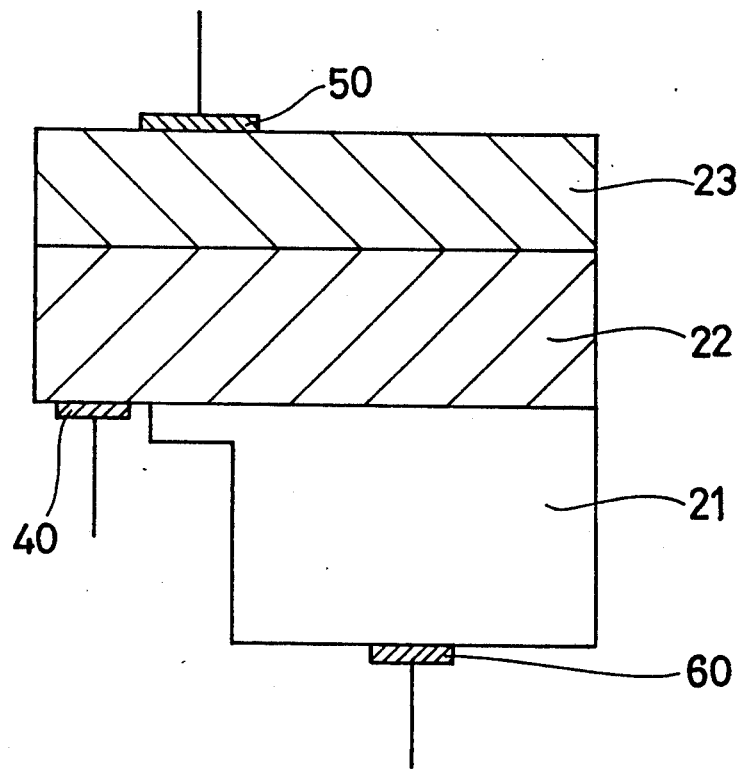

FIG. 8 show a eighth example of the present invention.

The drawing exemplifies a compound semiconductor light emitter of the present invention formed on a Si substrate. The present example constitutes a unit device for a light emitter of combination function type to be combined with Si integrated circuit or Si detector or the like.

In FIG. 8, 21 is a Si(100) substrate, 22 ZnS:Cl epitaxial film formed thereon, and 23 CdBeTe:Sb epitaxial film further formed thereon. In the construction of the present light emitter, on the Si(100) substrate 21 in vacuum $1 \times 10^{-10}$ Torr or less by MBE process were grown Zn at molecular beam pressure $1 \times 10^{-6}$ Torr, S at molecular beam pressure $5 \times 10^{-6}$ Torr, and Cl at molecular beam pressure $5 \times 10^{-9}$ Torr as n type impurity with the substrate temperature being at 260° C. to form n type ZnS:Cl layer of 10 μm in thickness.

The surface of the Si(100) substrate 21 was applied with chlorine (ZnCl$_2$) beam in ultra-high vacuum $1\times10^{-10}$ Torr and at substrate temperature of 500° C. or more to conduct surface cleaning for preliminarily removing oxide film, thereby enabling a sufficiently epitaxially grown film. ZnS layer 22 was grown at the substrate temperature of 260° C. after cleaning the Si substrate.

CdBeTe layer 23 selected Sb as p type impurity and grown thereon Cd at molecular beam pressure $0.4\times10^{-7}$ Torr, Be at molecular beam pressure $5\times10^{-7}$ Torr, Te at molecular beam pressure $7.5\times10^{-7}$ Torr and Sb at molecular beam pressure $1\times10^{-9}$ Torr to form CdBeTe:Sb layer of 2 μm in thickness providing p type current application and light emitting layer.

The n type ZnS layer 22 formed as current application light emitting layer in the present structure is added much with an impurity such as Cl, Al or the like to form a single-crystal layer not containing twin crystal. p type CdCdBeTe layer is similarly required to be added much with an impurity. Density of Al(Cl) in the ZnS:Cl layer 22 is preferably $1\times10^{-18}$ to $1\times10^{20}$cm$^{-3}$, and density of Sb in CdCdBeTe:Sb layer $5\times10^{17}$ to $8\times10^{19}$cm$^{-8}$. Resistivity of ZnS:Al(Cl) layer is preferably 0.001 to 10 Ω.cm and that of CdBeTe:Sb layer 0.005 to 10 Ω.cm. The resultant CdBeTe layer 23 and ZnS:Al(Cl) layer 22 each emits at room temperature blue and ultraviolet light of peak wavelength of 2.75 to 3.5 eV and 2.75 to 2.85 eV, respectively. A part of Si substrate was etched for removal by use of HF etching solvent and the exposed ZnS layer 22 was removed at its surface by use of reactive dry etching process using CF$_4$ gas (at 0.1 Torr with applied high frequency 200 mW) to deposit Al electrode 40 in vacuum at $1\times10^{-9}$ Torr by electron beam deposition process. The Au electrode was formed on CdBeTe layer 23 in the same manner as the foregoing example. The resultant CdBeTe/ZnS/Si Electroluminescent device is useful for manufacture of blue light emitting diode which emits blue light of peak wavelength 450 nm with 20 mA current voltage 5 V.

The present Electroluminescent device of the present example is quite useful for an output modulation type of light emitter to functional LED device to provide an emission output control type of light emitter or the like of quite high output stability, controlling current and voltage of CdBeTe/ZnS light emitting part by using as control signals output from Si photo detector, SiIC, SiCCD or the like assembled in Si substrate 21 as control signals.

EXAMPLE 9

Figure 9:
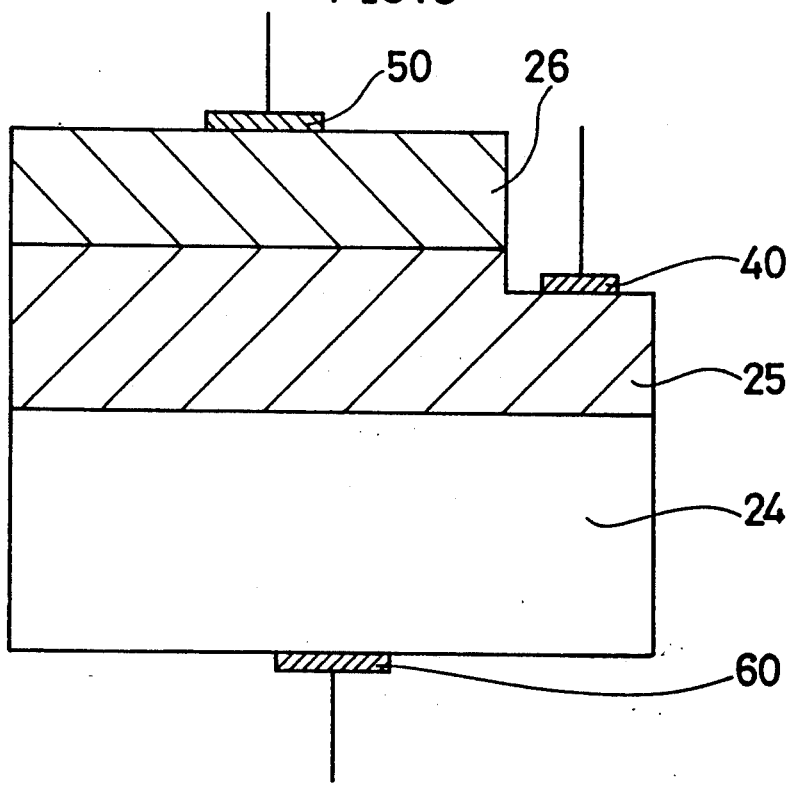

FIG. 9 shows a nineth example of the present invention.

In FIG. 9, 24 is Ge(100) substrate, 25 ZnSe:Al epitaxial layer, and 26 CdBeTe:As epitaxial layer. The basic construction of the device may be formed in the same manner as in the example 1 except the feature of Ge(100) substrate.

In the example 9, after formation of the epitaxial layers, a part of CdBeTe layer was removed by reactive ion etching, electrodes for light emitter 40 and 50 were formed in a plainer-like shape and additional electrodes 40 and 60 made of Ge junction system for a photo detector element were provided.

The CdBeTe/ZnSe blue LED of the above construction is useful for photo output controlling LED as those of the examples 1 and 8.

EXAMPLE 10

Figure 10:
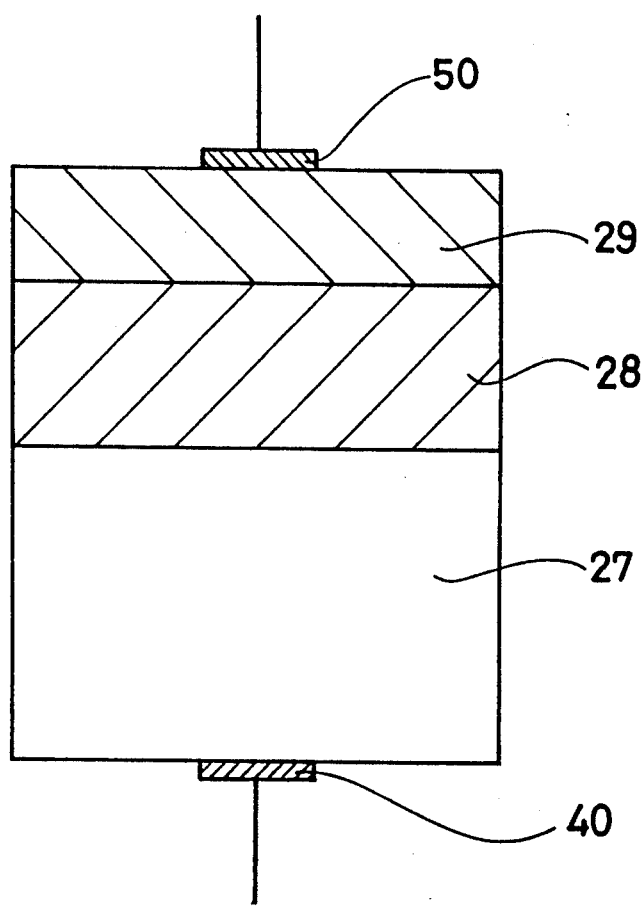

A tenth example of the present invention is shown in FIG. 10.

In the drawing, 27 is n type GaP(100) substrate, 28 n type epitaxial layer of ZnS:Ga and 29 p type epitaxial layer of CdBeTe:As. The Electrluminescent device of the example constructed above emits green light (555 nm) by the fact that a part of blue light (460 nm) emitted by CdBeTe/ZnS blue light emitting part excites the GaP substrate, so that the light emitter device is useful for two light band device and variable tone device that can emit blue and green light.

Particularly, a high luminous pure blue and green light emitting diode can be constructed by removing a part of GaP substrate or the epitaxial layers through etching. Hence, the light emitter device may be effectively combined with LED of GaAsP, GaAlAs or the like to constitute high luminous white light emitting diode.

EXAMPLE 11

Figure 11:
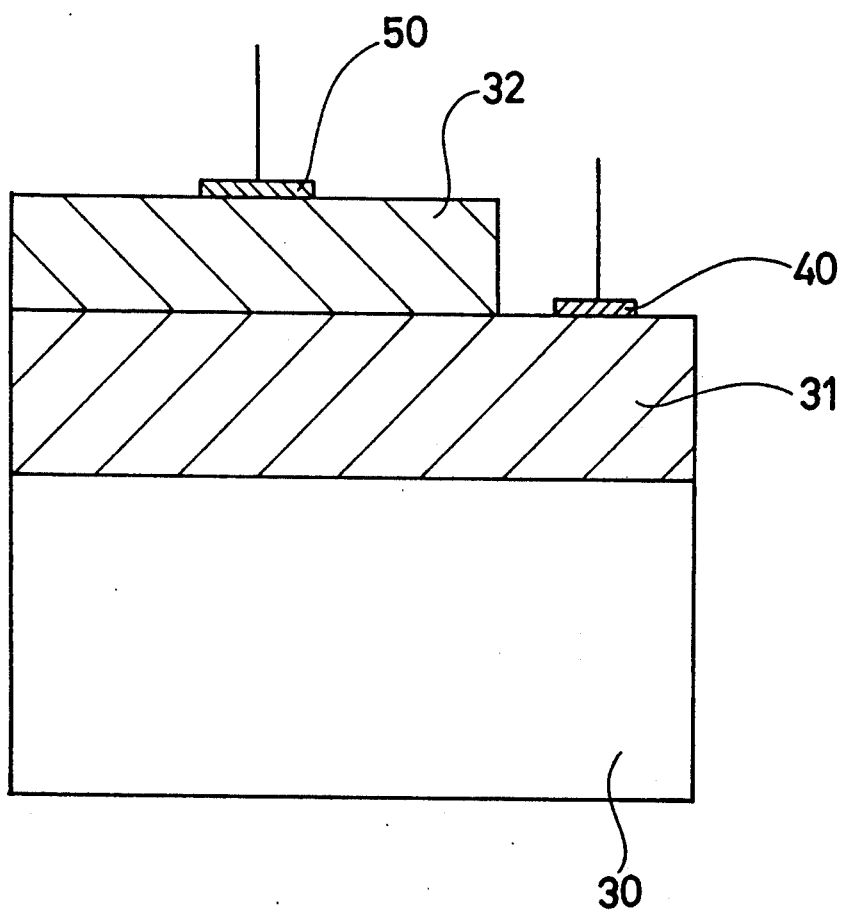

FIG. 11 shows a eleventh example of the present invention, wherein 30 is ZnS(100) substrate, 31 n type ZnS:Al epitaxial layer, and 32 p type CdBeTe:As epitaxial layer. The device has substantially the same construction as of the second example except that a plainer type of electrode is adopted, providing a high luminous blue light emitting diode which emits intensive blue light from the ZnS substrate 30.

The structure of the present example is quite useful for a high luminous Electroluminescent device which emits light including blue light and may be adapted to provide screens for plain display or the like.

EXAMPLE 12

The twelfth example of the present inveniton will be detailed by exemplifying a Electroluminescent device using ZnSe as substrate crystalline.

Figure 12:
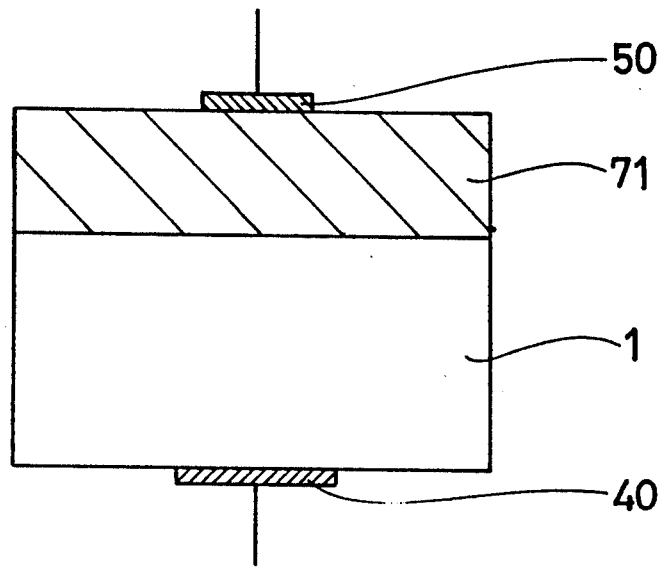

FIG. 12 is a diagram showing a structure of the Electroluminescent device of the twelfth example of the present invention. n type substrate crystalline ZnSe:Ga1 is ZnSe(100) substrate in thickness of 300 μm which is cut out of ingot of single-crystal ZnSe grown by iodine transport process. The ZnSe substrate was heated in Zn+Ga solution (Zn90:Ga10) at 950° C. for 100 hours to have low resistivity (1 Ω.cm). p type epitaxial crystalline layer Zn$_{1-y}$Be$_y$Te:As 71 on the n type ZnSe(100) substrate 1 were formed by molecular beam epitaxy process (MBE) and has resistivity of 0.1 Ω.cm.

In the MBE growth, the ZnSe substrate was first applied with chemical etching in a methanol (CH$_3$OH) solution added with 5% of Br followed by treating surface of the device for purification in ultra-high vacuum of 1 to $3\times10^{-10}$ at 500° C. for few minutes to 30 min. Then, on the surface of ZnSe(100) single-crystal substrate 1 set at 260° C. were grown Zn at molecular beam pressure $5\times10^{-8}$ Torr, Be at molecular beam pressure $5\times10^{-7}$ Torr, Te at molecular beam pressure $5\times10^{-7}$ Torr and As at molecular beam pressure $2\times10^{-10}$ Torr for 3 hour to form p type Zn$^{1-x}$Be$^x$Te:As growth layer 71 (x=0.95).

In FIG. 12, 40 is a negative electrode made of Al, and 50 a positive electrode made of Au. The Au positive electrode 50 was preferably provided in such manner that after formation of ZnBeTe:As epitaxial layer, the positive electrode was deposited in vacuum of 1 to 3 $10^{-9}$ Torr in an electrode formation chamber adjacent of MBE chamber through a transport room and heated together with Al negative electrode 40 at 300° C. to be ohmic. The Al negative electrode 40 was formed by electron beam deposition in such manner that after chemical etching, the rear surface of ZnSe substrate 1 was removed 20 to 100 μm in thickness in vacuum less than $1 \times 10^{-8}$ Torr and Al was deposited on the rear surface of ZnSe:Ga substrate 1 heated to 300° C. to form an ohmic electrode.

The ZnBeTe:As epitaxial layer 71 formed above has lattice constant 5.675 Å differing 0.1% or less from lattice constant of ZnSe in the substrate (5.67 Å), thereby exhibiting an electron beam diffraction pattern in a quite excellent streak shape to confirm that the layer 2 is an excellent single-crystal epitaxial film.

The light emitter device allowed current 20 mA to flow therethrough at 3 V by application of voltage and emitted at room temperature blue light of peak wave about 460 nm recombined in band gap of ZnSe. Observed in emission spectrum upon application of current were only faint emission about 530 nm in wavelength and 1/10000 or less in intensity together with the main light emission band 460 nm in wavelength.

As explained in the example, the luminescent layer comprises a single-crystal substrate, so that light emission spectrum is the substantially same as that observed in photoluminescence of the substrate itself. Also, intensity of band gap emission (460 nm emission band) increases depending on applied current density, so that it can be set to such driving condition that ignores other low energy emission (530 nm emission shown in the present example) whose intensity depends mainly on defects or the amount of impurities.

ZnBeTe:As layer 71 comprising the epitaxial film 71 has lattice constant substantially corresponding to that of ZnSe substrate 1 (5.67 Å) to form a single-crystal layer of high quality as a whole, thereby exhibiting an excellent electrical properties (0.1 Ω.cm) as a current application layer.

As seen in the present example, the present invention enables blue light emitting diode of a quite simple construction with high luminous efficiency.

EXAMPLE 13

Figure 13:
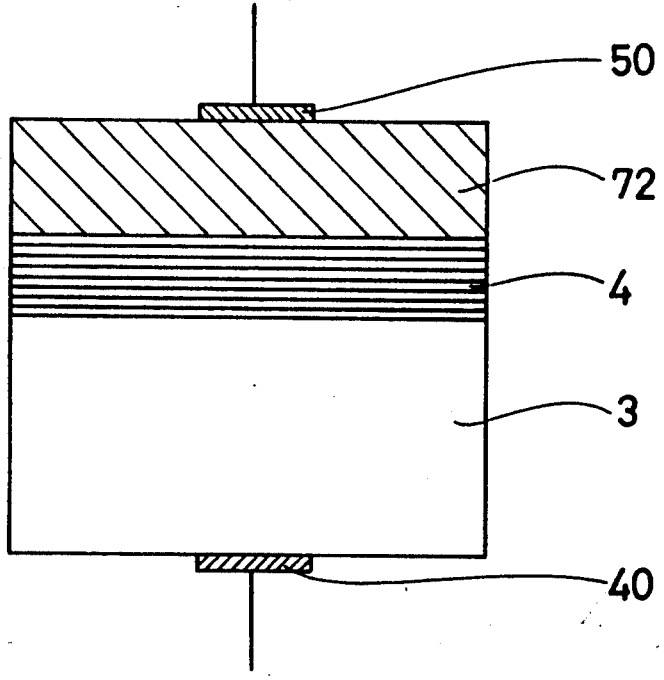

A thirteenth example of the present invention is shown in FIG. 13.

The device was prepared by MBE process as in the foregoing example. In FIG. 13, 3 is n type ZnS(100) substrate, 4 n type ZnS/ZnSe ultra-lattice epitaxial layer, and 72 p type $Zn_{1-z}Be_zTe$:P epitaxial layer. Also, 40 is Al negative electrode and 50 Au positive electrode, these being provided substantially in the same manner as in the twelfth example except the heating condition for forming ohmic electrodes.

The n type ZnS(100) substrate 3 was a single-crystal substrate made of bulk single-crystal prepared by iodine transport process and was processed, in melting zinc added with 10% of Al, at 950° C. for 100 hours to have low resistivity (5 Ω.cm).

The substrate crystal was excited in photoluminescence by use of violet source of 310 nm (Xe lamp) or 325 nm (He—Cd laser) to exhibit at room temperature a broader emission band to a high luminous deep level of peak wavelength of 460 nm and a band edge emission of peak wavelength of 340 nm.

Grown on the substrate 3 in vacuum (back pressure) 1 to $2 \times 10^{-10}$ Torr were Zn at molecular beam pressure $1 \times 10^{-6}$ Torr, S at molecular beam pressure $5 \times 10^{-6}$ Torr, Se at molecular beam pressure $1 \times 10^{-6}$ Torr and with substrate temperature at 260° C. to form a ZnS/ZnSe (5 nm/5 nm-50) ultra-lattice 4 comprising 10 to 50 layers of pairs of ZnS film of 5 nm in thickness and ZnSe film of 5 nm in thickness, on which ultra-lattice 4 are further grown Zn at molecular beam pressure $5 \times 10^{-8}$ Torr, Be at molecular beam pressure $4.5 \times 10^{-7}$ Torr, Te at molecular beam pressure $4 \times 10^{-7}$ Torr and P at molecular beam pressure $1 \times 10^{-9}$ Torr and with the same substrate temperature to form p type ZnBeTe:P layer 72. Thickness of the ultra-lattice layer 4 was 0.1 to 0.5 μm and that of ZnBeTe layer 5 was 3 μm.

In the above structure, lattice inconsistency between the substrate ZnS 3 and the $Zn^{1-y}Be^yTe$ layer 72 is quite large as 4% even at minimum (i.e., x=1), so that a direct and simple heteroepitaxial growth causes ZnBeTe layer 72 to be readily twin-crystallized (polycrystallized), thereby not providing crystalline films of a sufficient high quality.

The provision of the ultra-lattice layer allows the ZnBeTe layer 72 to be readily signle-crystal with high quality. ZnBeTe layer may be preferably joined onto ZnSe layer.

In the structure of the present example, composition of $Zn_{1-x}Be_xTe$ can be selected in a wider range of x ($0 \leq x \leq 1$, preferably $0.2 \leq x \leq 1.0$). Alternatively, ZnBeTe layer 72 may be deposited with a modified composition (x) and emission wavelength may be set to 500 to 430 nm for blue light even when the ZnBeTe layer makes emission.

The joint type of Electroluminescent device (x=0.9) in the example allowed current 10 mA to flow therethrough at 4 V by application of voltage and emitted at room temperature blue violet light. Emission spectrum includes a broad blue band of 460 nm peak wavelength and a violet band of about 430 nm peak wavelength, the former corresponding to blue light from the substrate 3 and the latter to violet light from the ultra-lattice layer 4. Ratio of intensity of emission of the two bands changes corresponding to applied voltage and the amount of applied current.

Relative thickness of films for the ultra-lattice layer 4 may be set to allow each layer section to be 0.5 to 10 nm in thickness. In this case, every combination of thickness may do, but ZnSe 1 nm-ZnS 9 nm is most preferable. Emission of the ultra-lattice layer 4 may be changed from 430 to 460 nm corresponding to modified specific film thickness of layer 4.

As seen in the present example, the present invention enables construction of not only blue light emitting diode with high luminous efficiency but also a light emitter of the type controlling high luminous short wavelength including violet light.

EXAMPLE 14

Figure 14:
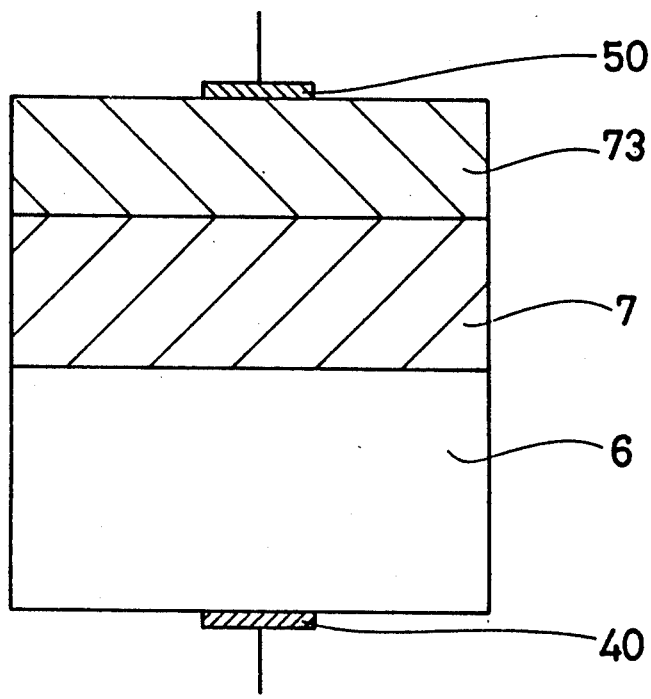

FIG. 14 shows a fourteenth example of the present invention.

The device of the present example was prepared by MBE process similarly to the foregoing examples.

In FIG. 14, 6 is wafer of ZnS(100) substrate which is n type crystal having the same resistivity as in the thirteenth example. 7 is $ZnS_{1-z}Se_z$ film of 1 μm in thickness grown by MBE, and x is a composite inclined buffer layer changing between 0 to 1 from the substrate 6 to ZnBeTe growth layer 73 with concentration of Al being $1 \times 10^{13} cm^{-3}$ and resistivity 0.05 Ω.cm. Layered on the $ZnS_{1-z}Se_z$ layer 7 was a p type ZnBeTe:As layer 8 formed under the same condition as of the twelfth example and of 2 μm in thickness and 0.1 Ω.cm of resistivity. 40 and 50 are electrodes formed in the similar manner to the foregoing two examples.

The structure of this example has the substantially same effect as of the thirteenth example. $ZnS_{1-z}Se_z$ layer 7 serving as a light emitting layer and the substrate ZnS:Al 6 contribute to emission. Particularly at low voltage, the buffer layer 7 has high emission in 460 nm narrow band at its solid solution region having ZnSe composition, and increases emission a the high ZnS composition region extending to the substrate ZnS composition under high applied voltage and applied high current density to make wider blue light emitting band of 500 nm or less in wavelength, thereby increasing luminance. When ZnSe layer in the ZnSSe layer 7 is made thicker to 0.5 to 2 μm, ZnSe emitting layer of high quality can be achieved with emission spectrum exhibiting an intensive single blue light of 80 nm of half band width and 460 nm of peak wavelength (2.65 eV).

As clearly seen in the example, the present invention can provide a novel high luminous blue Electroluminescent device.

EXAMPLE 15

Figure 15:
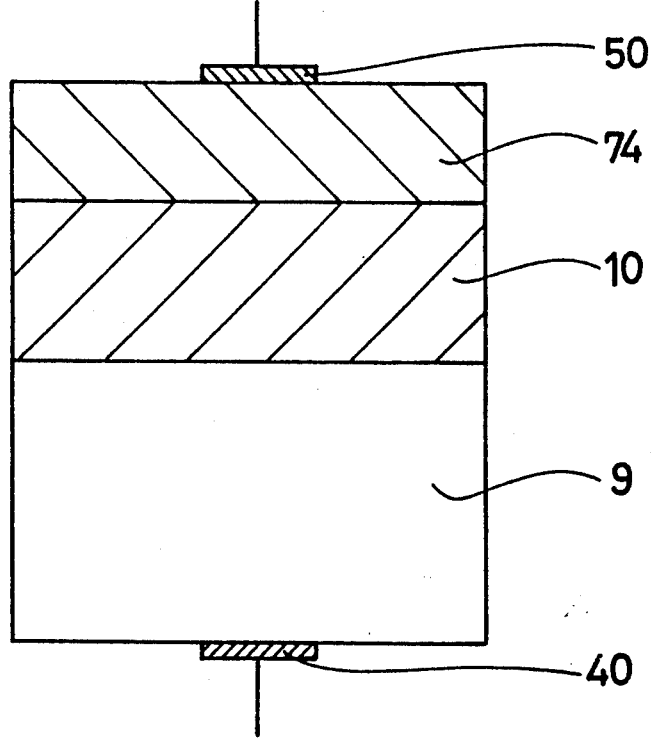

FIG. 15 shows a fifteenth example of the present invention.

In FIG. 15, 9 is n type GaAs(100) substrate, 10 n type ZnSe film 10 μm in thickness added with Ga and subjected to MBE growth, and 74 p type ZnBeTe film 2 μm in thickness similarly added with As and subjected to MBE growth on the ZnSe film.

In the present example, lattice inconsistency between the GaAs substrate 9 and the first epitaxial layer ZnSe:Ga 10 is about 0.3% while lattice inconformity between the first epitaxial layer ZnSe:Ga and the second epitaxial layer ZnBeTe:As layer 74 is 0.1% or less with lattice constant decreasing from the substrate toward the second epitaxial layer, thereby allowing strain of lattice between the substrate epitaxial layer 10 and the epitaxial layer 74 to be relatively small. The layers have the substantially same properties as those shown in the twelfth example. Resistivity of ZnSe:Ga layer 10 5 μm in thickness is 1 Ω.cm, and there is shown properties for a light emitter that ZnBeTE:As layer 74 has resistivity of 0.1 Ω.cm and the ZnSe layer 10 causes emission due to recombination of electron and hole at band gape by applying electron-holes from ZnBeTe layer 74 to ZnSe layer 10. In the present example, activity at maximum of p type impurity in ZnBeTe hole applying layer is quite higher as 50% in comparison with the ZnSe:O hole applying layer in the conventional example (FIG. 23), and band gap of ZnBeTe at the hole applying side is larger by about 0.8 eV than ZnSe, so that hole applying efficiency is made quite higher (improved 1000 times or more in properties at room temperature in comparison with the conventional example), thereby providing quite high luminous intensity at room temperature to allow high luminous blue light of 460 nm of peak wavelength to be observed.

As clearly seen from the twelfth example and the present fourth example, the prenet invention can provide a novel fundamental method of structuring ZnSe high luminous blue LED.

EXAMPLE 16

Figure 16:
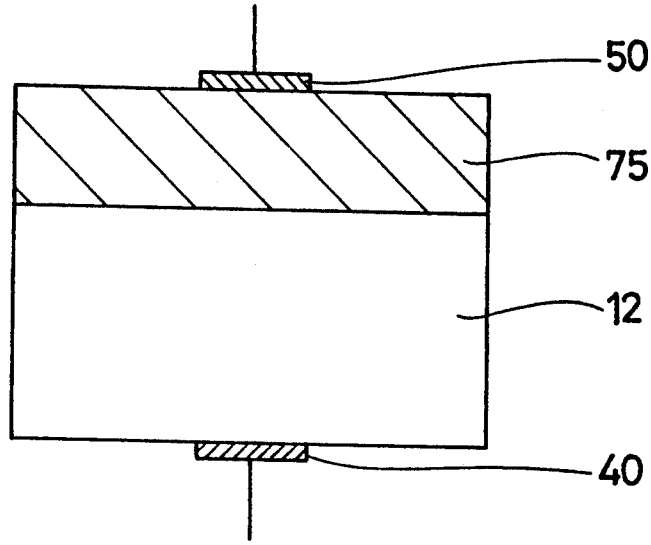

FIG. 16 shows a sixteenth example of the present invention.

In the present example, the substrate used ZnSSe solid solution single-crystal. Use of the present structure enables lattice conformity in crystals of substrate ZnSSe and epitaxial ZnBeTe. In FIG. 16, 12 is n type $ZnS_{0.10}Se_{0.90}$ (100) substrate wafer provided in such manner that bulk single crystal grown by iodine transport process as in the 13th and 14th examples was processed to have resistivity of 1 Ω.cm and then be cut out followed by application of mechanical grinding with particles of 0.3 μm and chemical etching by use of methanol ($CH_3OH$) solution containing 5% of bromine (Br) and heating in ultra-high vacuum of 1 to $3 \times 10^{-10}$ Torr. $ZnS^{0.10}Se^{0.90}$ crystal has band gap energy of about 2.8 eV and wavelength at absorption end corresponds to 443 nm. Hence, the present example provides a structuring method that can enable lattice conformity and formation of a wide gap application layer. 75 is ZnBeTe epitaxial layer provided on the substrate 12 to form p type ZnBeTe:As layer 75 which grown for 3 hours to be 3 μm in thickness with Zn at molecular beam pressure $5 \times 10^{-8}$ Torr, Be at molecular beam pressue $3 \times 10^{-7}$ Torr, Te at molecular beam pressure $2.5 \times 10^{-7}$ Torr and As at molecular beam pressure $1 \times 10^{-9}$ Torr with substrate temperature at 250° C. in vacuum $2 \times 10^{-10}$ Torr. The ZnBeTe:As layer 75 was highly added with As (preferably $1 \times 10^{16}$ to $1 \times 10^{19} cm^{-8}$ as p type impurity) to have carrier concentration $8.5 \times 10^{18} cm^{-3}$ and resistivity 0.01 Ω.cm, thereby being quite suitable for current (positive hole) application layer. The resultant ZnBeTe layer exhibits a quite excellent crystallizability from the initial stage of crystalline growth as clearly appreciated from reflected high speed electron beam diffraction pattern.

The Electroluminescent device shown in the present example does not include such a defective interface layer even near an interface between ZnSSe substrate 12 and ZnBeTe epitaxial layer 75 that has disturbed crystalline lattice caused by inconformity of the layers, so that the interface growth layer is quite low in concentration of defects and quite superior in specific properties upon application of low voltage. Hence, current 10 mA or more is allowed to flow upon application of 1.5 V, and recombination due to application of current allows high luminous blue violet emission of 443 nm of peak wavelength and luminance of 50 mcd or more.

For formation of the structure shown in the example, a preferable composite range of z for $ZnS_{1-z}Se_z$ is 0.75 to 1.0. It is preferable that the composition z near the interface to the $Zn_{1-y}Be_y$ Te epitaxial layer 13 approaches the range 0.83 to 1.0 corresponding to the composition x.

As shown in the example, the present invention is quite useful in manufacture of high luminous short wave light emitting diode.

40 is In-Al negative electrode and 50 Au positive electrode.

EXAMPLE 17

Figure 17:
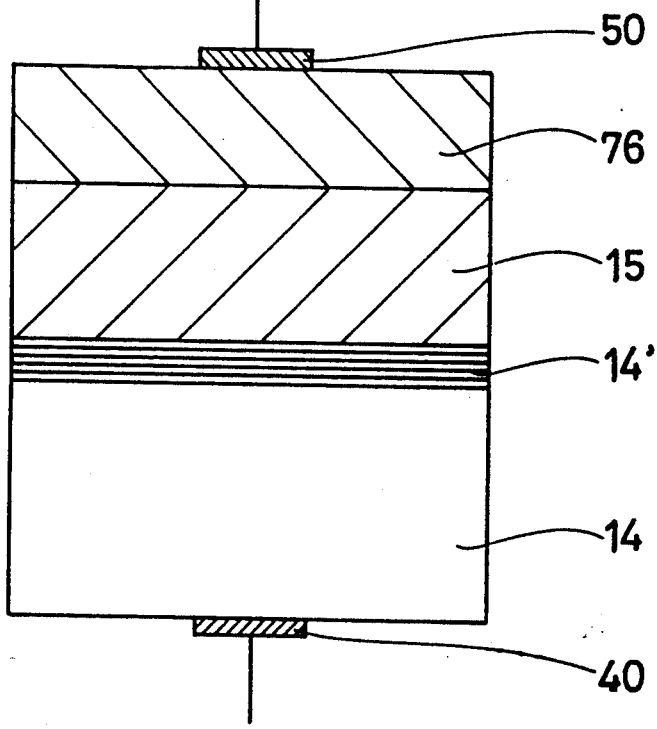

A structure of the device of a seventeenth example of the present invention is shown in FIG. 17.

In FIG. 17, 14 is n type ZnS(100):Al substrate of low resistivity, 15 (MBE) epitaxial n type ZnSe(100):Ga layer of low resistivity, 76 (MBE) epitaxial p type low resistivity ZnBeTe(100):As layer. The similar substrates as used in the foregoing examples 12 to 15 were employed to achieve the same level of properties in the epitaxial films.

ZnS:Al(100) used as the substrate 14 and n type epitaxial substrate 15 preferably have resistivity 0.1 to 10 Ω.cm, carriers density $10^{16}$ to $3\times10^{18}cm^{-3}$ and 0.5 μm or more in thickness (or 0.3 to 5 μm when a buffer layer 14′ is provided between the substrate 14 and the epitaxial emitter substrate layer 15). Preferable resistivity of ZnBeTe:As (or P) to be formed as current application layer 16 is 20 to 0.005 Ω.cm and preferable carriers density is $10^{16}$ to $5\times10^{19}cm^{-3}$. Impurities to be introduced into the emitting layer 15 may employ indium (In), chlorine (Cl), iodine (I), bromine (Br) or fluorine (F) or the like other than Ga and Al, and those for current application layer 76 are preferably nitrogen (N), antimony (Sb), lithium (Li), sodium (Na), potassium (K) or the like other than As, P.

The device structure shown in the example can set band gap at portions other than light emitting region to be transparent to emission by use of the same feature as shown in the foregoing 13th, 14th and 16th examples, so that this structure is quite useful for a required device structure wherein emission through application of current is not reabsorbed by a substrate epitaxial layer.

EXAMPLE 18

Figure 18:
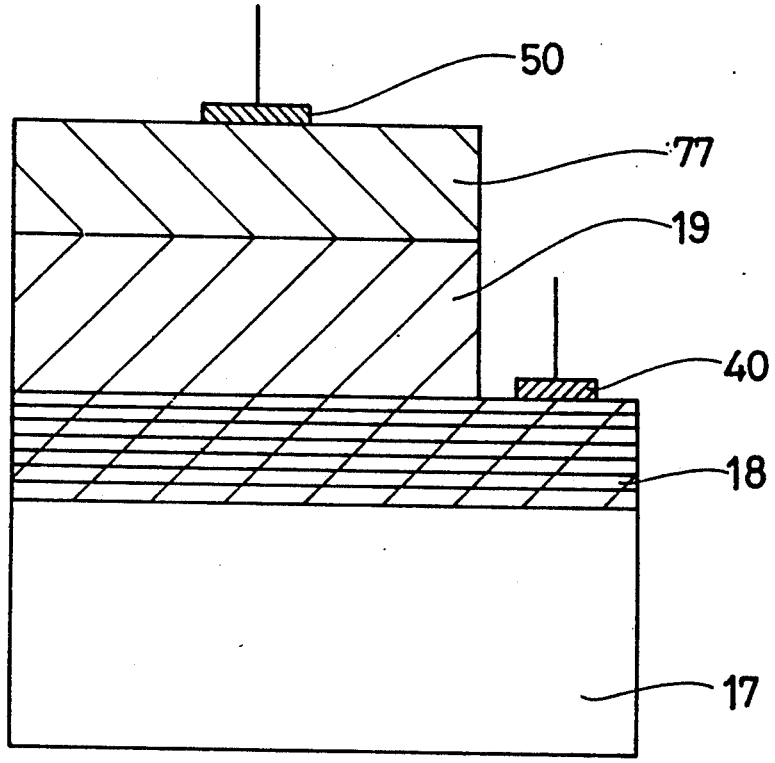

FIG. 18 shows a eighteenth example of the present invention.

The present example exemplifies a device structure of ultra-high luminous ZnSe blue LED comprising as current application layer ZnBeTe solid solution epitaxial single-crystal 20 sequentially formed on high resistivity ZnS(100) single-crystal substrate 17.

In FIG. 18, 17 is ZnS(100) substrate of 300 μm in thickness cut out of ZnS bulk single-crystal grown by iodine transport process, and 18 is n type buffer conductive layer of ZnS/ZnSe:Al fomred the substrate 17 and comprising ZnS/ZnSe (5 nm/5 nm) ultra-lattices of 1 μm in thickness including sequentially layered sets of 100 ZnS films (5 nm in thickness) and 100 ZnSe films (5 nm in thickness) each prepared by MBE process through the same process as cited in the foregoing examples. In the ZnS layer of the buffer layer was added $3\times10^{19}cm^{-3}$ of Al as n type impurity and average resistivity in the layer 18 was 0.002 Ω.cm, so that the layer 18 acts as a buffer conductive layer. 19 is an emitting layer formed on the ultra-lattice conductive layer of 0.5 to 6 μm in thickness and added with Al as n type impurity preferably in the range of 1016 to $10^{19}cm^{-3}$ to have resistivity of 1 to 0.01 Ω.cm, so that the ZnSe:Al layer forms an excellent single-crystal film which has low resistivity and exhibits luminous properties only of band edge emission (460 nm). Thickness of the layer 19 may be decreased or increased. When the layer 19 is made thicker, the layer itself reabsorbs its emission to lower luminous efficiency. It is not preferable to use a thicker layer 19 larger in thickness than required. p type current application layer 77 of Zn0.1Be0.9Te:As formed on the luminescent layer 19 is a solid solution epitaxial film having conformity of lattice with the ZnSe emitting layer 19 and forming a single-crystal film of high quality. The current application layer 77 is not limited in thickness and As may be preferably added thereto as p type impurity in the range of concentration of $1\times10^{16}$ to $5\times10^{19}cm^{-3}$. Also, the layer 20 has preferably resistivity of 0.01 to 1 Ω.cm and carrier density of $1\times10^{16}$ to $9\times10^{18}cm^{-3}$. The current application layer 77 has band gap 3.4 eV and operates as a current application layer having higher current application efficiency with respect to the ZnSe emitting layer 19. 40 and 50 are negative and positive electrodes made of Al and Au respectively as commonly provided in the examples 12 to 17. These electrodes are formed preferably in vacuum condition in an electrode formation chamber and a reactive ion beam etching chamber (RIBE}provided adjacent to MBE epitaxial vacuum chamber, in which the semiconductor layers 18, 19, 77 are formed, through a transport room.

Al was grown by vacuum deposition (or electron beam deposition) at $10^{-8}$ Torr or less, and Au was also deposited in vacuum at $10^{-9}$ Torr or less. The negative and positive electrodes 40 and 50 are hard to form sufficient ohmic electrodes due to the fact that the crystalline surfaces of the layers 18 and 77 readily change in atmosphere or low vacuum ($10^{-5}$ Torr or more). Hence, the electrodes 40 and 50 are preferable to be formed in ultra-high vacuum at $10^{-8}$ Torr or less.

The Electroluminescent device of the present example prepared as above can allow current of 1 mA or more to flow therethrough at quite low applied voltage 4.5 V or less similarly as in the preceding example 17. Upon application of lwo drive current, emission luminance of blue light band of peak wavelength 460 nm is over 50 mcd, thereby providing properties of blue light emitting diode with high luminance and high color purity.

As clearly seen in the present example, the present invention has a fundamental utility related to manufacture of a short wave light emitter of notably improved various properties, such as ultra-high luminous blue light emitting diode which is a quite important element for industry.

EXAMPLE 19

Figure 19:
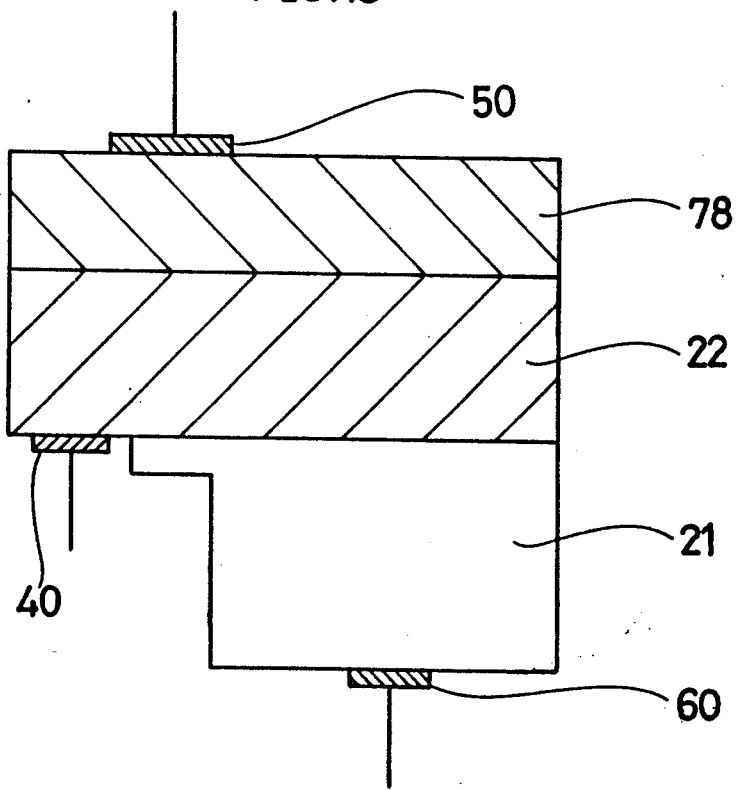

FIG. 19 show a nineteenth example of the present invention.

The drawing exemplifies a Electroluminescent device compound semiconductor light emitter of the present invention formed on a Si substrate. The present example constitutes a unit device for a light emitter of combination function type to be combined with Si integrated circuit or Si detector or the like.

In FIG. 19, 21 is a Si(100) substrate, 22 ZnS:Cl epitaxial film formed thereon, and 78 ZnBeTe:Sb epitaxial film further formed thereon. In the construction of the present light emitter on the Si(100) substrate 21 in vacuum $1\times10^{-10}$ Torr or less by MBE process were grown Zn at molecular beam pressure $1\times10^{-6}$ Torr, S at molecular beam pressure $5\times10^{-6}$ Torr and Cl at molecular beam pressure $5\times10^{-9}$ Torr as n type impurity with the substrate temperature being at 260° C. to form n type ZnS:Cl layer of 10 μm in thickness.

The surface of the si(100) substrate 21 was applied with chlorine (ZnCl2) beam in ultra-high vacuum $1\times10^{-10}$ Torr and at substrate temperature of 500° C. or more to conduct surface cleaning for preliminarily removing oxide film, thereby enabling a sufficiently epitaxially grown film. ZnS layer 22 was grown at the substrate temperature of 260° C. after cleaning the Si substrate.

ZnBeTe layer 78 selected Sb as p type impurity and grown thereon Zn at molecular beam pressure $0.7\times10^{-7}$ Torr, Be at molecular beam pressure $7\times10^{-7}$ Torr, Te at molecular beam pressure $7.5\times10^{-7}$ Torr and Sb at molecular beam pressure $1 \times 10^{-9}$ Torr to form ZnBeTe:Sb layer of 2 μm in thickness providing p type current applicaton and luminescent layer.

The n type ZnS layer 22 formed as current application luminescent layer in the present structure is added much with an impurity such as Cl, Al or the like to form a single-crystal layer not containgin twin crystal. p type ZnBeTe layer is similarly required to be added much with an output from si photo detector, SiIC, SiCCD or the like assembled i Si substrate 21 as control signals.

EXAMPLE 20

Figure 20:
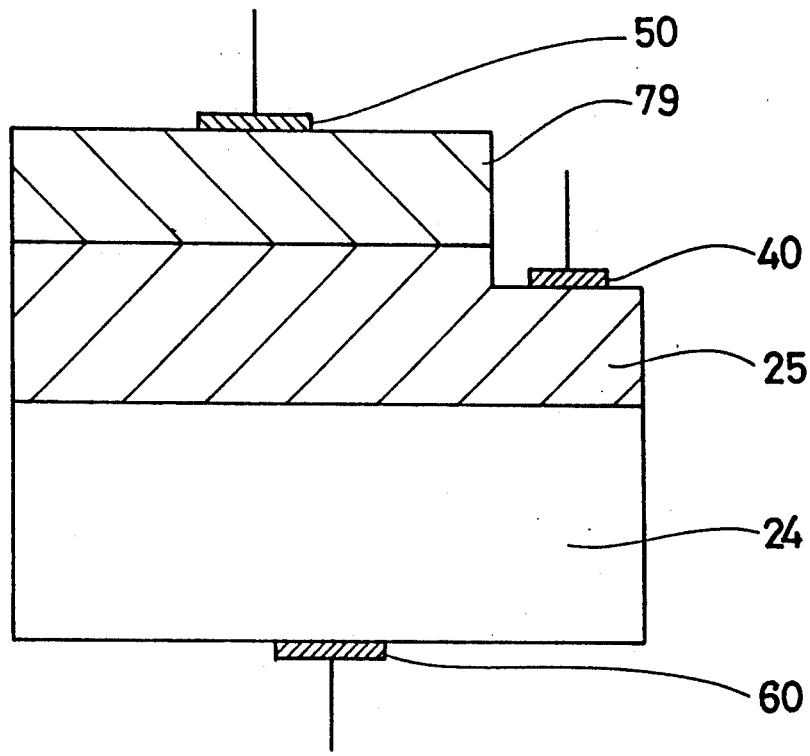

FIG. 20 shows a twentieth example of the present invention.

In FIG. 20, 24 is Ge(100) substrate, 25 ZnSe:Al epitaxial layer, and 79 ZnBeTe:As epitaxial layer. The basic construction of the device may be formed in the same manner as int he example 12 except the feature of Ge(100) substrate.

In the example 20, after formation of the epitaxial layers, a part of ZnBeTe layer 79 was removed by reactive ion etching, electrodes for light emitter 40 and 50 were formed in a plainer-like shape and additional electrodes 40 and 60 made of Ge junction system for a photo detector element were provided.

The ZnBeTe/ZnSe blue LED of the above construction is useful for photo output controlling LED as those of the examples 12 and 19.

EXAMPLE 21

Figure 21:
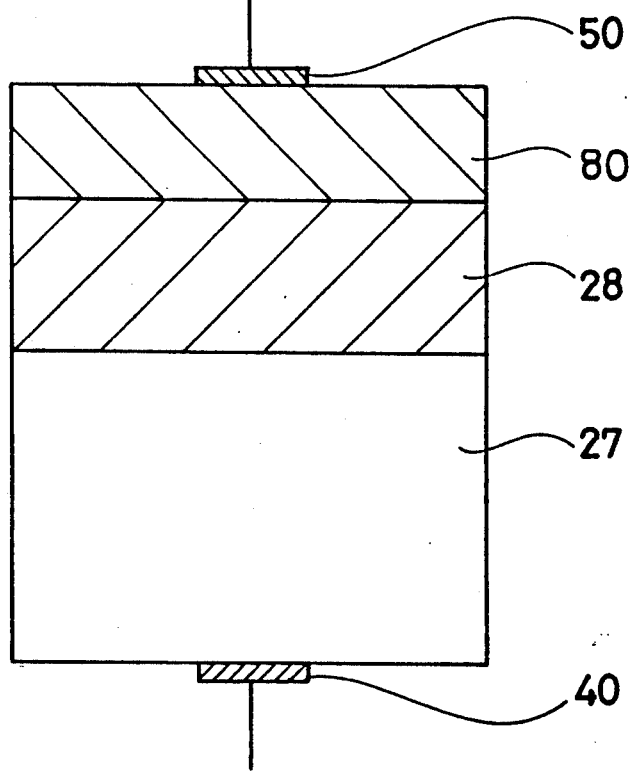

A twenty-first example of the present invention is show in FIG. 21.

In the drawing, 27 is n type GaP(100) substrate, 28 n type epitaxial layer of ZnS:Ga and 80 p type epitaxial layer of ZnBeTe:As. The light emitter of the example constructed above emits green light (555 nm) by the fact that a part of blue light (460 nm) emitted by CdBeTe/ZnS blue light emitting part excites the GaP substrate, so that the light emitter device is useful for two light band device and variable tone device taht can emit blue and green light.

Particularly, a high luminous pure blue and green light emitting diode can be constructed by removing a part of GaP substrate or the epitaxial layers through etching. Hence, the light emitter device may be effectively combined with LED of GaAsP, GaAlAs or the like to constitute high luminous white light emitting diode.

EXAMPLE 22

Figure 22:
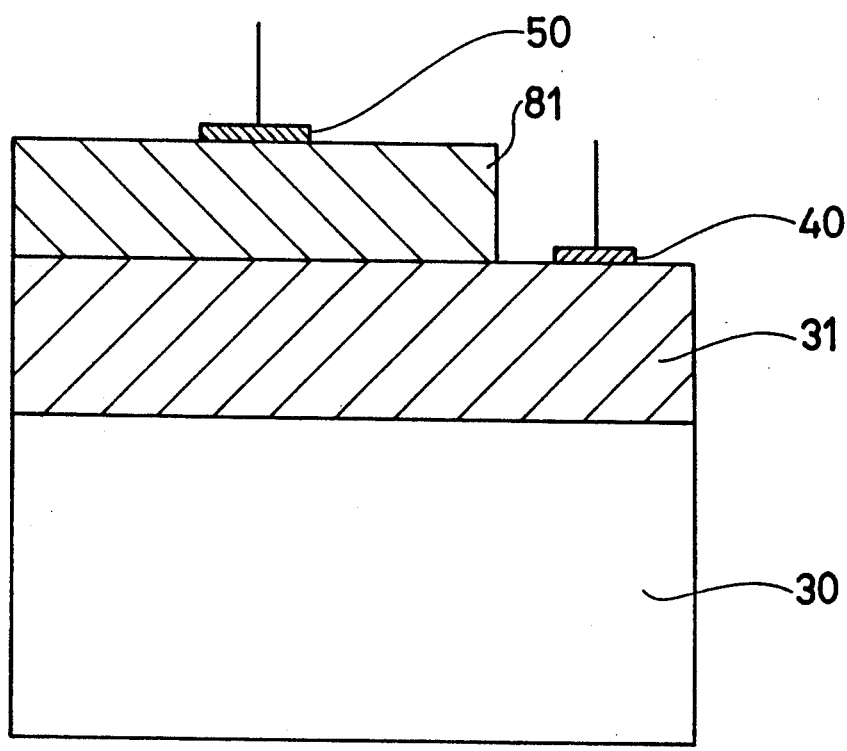

FIG. 22 shows a twenty-second example of the present invention, wherein 30 is ZnS(100) substrate, 31 n type ZnS:Al epitaxial layer, and 81 p type ZnBeTe:As epitaxial layer. The device has substantially the same construction as of the 13th example except that a plainer type of electrode is adopted, providing a high luminous blue light emitting diode which emits intensive blue light from the ZnS substrate 30.

The structure of the present example is quite useful for a high luminous light emitter device which emits light including blue light and may be adapted to provide screens for plain display or the like.

As seen from the above, the pn junction type of II-VI compound semiconductor light emitter prepared according to the present invention does, as clearly explained i the foregoing examples, enable to solve the essential problems of the conventional light emitter devices and is suitable for manufacture of a high luminous Electroluminescent device, such as high luminous blue light emitting diode, to emit light in short wave range (blue to ultraviolet) with stability and reproducibility. Hence, the present invention is applicable to semiconductor Electroluminescent device in the art of optoelectronics covering blue to ultraviolet light.

What We claimed is:

1. An electroluminescent device of compound semiconductor which is made of II-VI compound semiconductor to be in pn junction type, wherein n layer of the pn junction part comprises a II-VI compound semiconductor layer containing zinc as an essential composite element and p layer of the pn junction part comprises a II-VI compound semiconductor layer having an epitaxial layer containing M, Be and Te (wherein M is a group comprising Cd and Zn) as an essential composite element.

2. An electroluminescent device of compound semiconductor as set forth in claim 1, wherein the p layer has band gap larger than that of the n layer.

3. An electroluminescent device of compound semiconductor as set forth in claim 1, wherein the compound semiconductor of the n layer is represented by the following formula (II):

$ZnS_{1-z}Se_z (0 \leq z \leq 1)$

4. An electroluminescent device of compound semiconductor as set forth in claim 3, wherein the compound semiconductor of the n layer is a single crystal substrate made of the compound semiconductor represented by the formula (II).

5. An electroluminescent device of compound semiconductor as set forth in claim 3, wherein the n layer has at an interface with the p layer a super lattice layer comprising ZnS and ZnSe each heaped up alternately.

6. An electroluminescent device of compound semiconductor as set forth in claim 3, wherein the n layer has at an interface with the p layer a composite-inclined epitaxial layer comprising $ZnS_{1-x}Se_x (0 < x < 1)$.

* * * * *